(12) United States Patent
Iwao

(10) Patent No.: US 10,446,388 B2
(45) Date of Patent: Oct. 15, 2019

(54) SUBSTRATE PROCESSING DEVICE

(71) Applicant: SCREEN Holdings Co., Ltd., Kyoto (JP)

(72) Inventor: Michinori Iwao, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 81 days.

(21) Appl. No.: 15/834,764

(22) Filed: Dec. 7, 2017

(65) Prior Publication Data

US 2018/0096836 A1   Apr. 5, 2018

Related U.S. Application Data

(63) Continuation of application No. 14/652,471, filed as application No. PCT/JP2014/053760 on Feb. 18, 2014, now abandoned.

(51) Int. Cl.
*B01D 53/14* (2006.01)
*B01D 53/34* (2006.01)
(Continued)

(52) U.S. Cl.
CPC .... *H01L 21/02041* (2013.01); *B01D 53/1412* (2013.01); *B01D 53/346* (2013.01);
(Continued)

(58) Field of Classification Search
CPC ............ B01D 53/1412; B01D 53/1456; B01D 53/346; B01D 53/40; B01D 53/42; B01D 53/78; B01D 2251/50; B01D 2251/60; B01D 2258/0216; B08B 3/08; H01L 21/02041
(Continued)

(56) References Cited

U.S. PATENT DOCUMENTS

2002/0018737 A1   2/2002   Holst ............................ 422/169
2008/0102011 A1   5/2008   Moalem ................... 423/240 R
(Continued)

FOREIGN PATENT DOCUMENTS

CN    102258798    11/2011
JP    2-102709 A    4/1990
(Continued)

OTHER PUBLICATIONS

International Search report dated Apr. 28, 2014 in corresponding PCT International Application No. PCT/JP2014/053760.
(Continued)

*Primary Examiner* — Levon J Shahinian
(74) *Attorney, Agent, or Firm* — Ostrolenk Faber LLP

(57) ABSTRACT

A substrate processing apparatus includes a processing unit supplying at least one of a plurality of types of chemical liquids to a substrate and a scrubber cleaning an exhaust by bringing the exhaust in contact with a scrubbing liquid. The scrubber includes an exhaust passage that guides the exhaust, generated at the processing unit and containing the chemical liquid, toward an exhaust equipment disposed outside the substrate processing apparatus and a discharger that is able to discharge each of a plurality of types of scrubbing liquids that clean the exhaust individually inside the exhaust passage. A controller selects any one of the plurality of types of scrubbing liquids based on the type of chemical liquid contained in the exhaust and makes the selected scrubbing liquid be discharged from the discharger.

19 Claims, 8 Drawing Sheets

(51) Int. Cl.
  *B01D 53/40* (2006.01)
  *B01D 53/42* (2006.01)
  *B01D 53/78* (2006.01)
  *B08B 3/08* (2006.01)
  *H01L 21/02* (2006.01)
(52) U.S. Cl.
  CPC ............... *B01D 53/78* (2013.01); *B08B 3/08* (2013.01); *B01D 53/1456* (2013.01); *B01D 53/40* (2013.01); *B01D 53/42* (2013.01); *B01D 2251/50* (2013.01); *B01D 2251/60* (2013.01); *B01D 2258/0216* (2013.01)
(58) Field of Classification Search
  USPC .......................................................... 134/110
  See application file for complete search history.

(56) References Cited

U.S. PATENT DOCUMENTS

| | | | |
|---|---|---|---|
| 2009/0158613 A1 | 6/2009 | Aihara | 34/341 |
| 2009/0202407 A1 | 8/2009 | Hurley | 423/210 |
| 2014/0109430 A1 | 4/2014 | Aihara | 34/201 |

FOREIGN PATENT DOCUMENTS

| | | |
|---|---|---|
| JP | 05-56221 U | 7/1993 |
| JP | 05-168882 A | 7/1993 |
| JP | 11-016870 A | 1/1999 |
| JP | 2001-145819 | 5/2001 |
| JP | 2002-198343 A | 7/2002 |
| JP | 3081490 U | 8/2007 |
| JP | 2008-104919 | 5/2008 |
| JP | 2009-094525 | 4/2009 |
| JP | 2009-206303 | 9/2009 |
| JP | 2011-511710 | 4/2011 |
| TW | 200937562 | 9/2009 |

OTHER PUBLICATIONS

Written Opinion dated Apr. 28, 2014 in corresponding PCT International Application No. PCT/JP2014/053760.
Form PCT/IB/308—PCT Second and Supplementary Notice Informing the Applicant of the Communication of the International Application (to designated offices which apply the 30 month time limit under Article 22(1)).

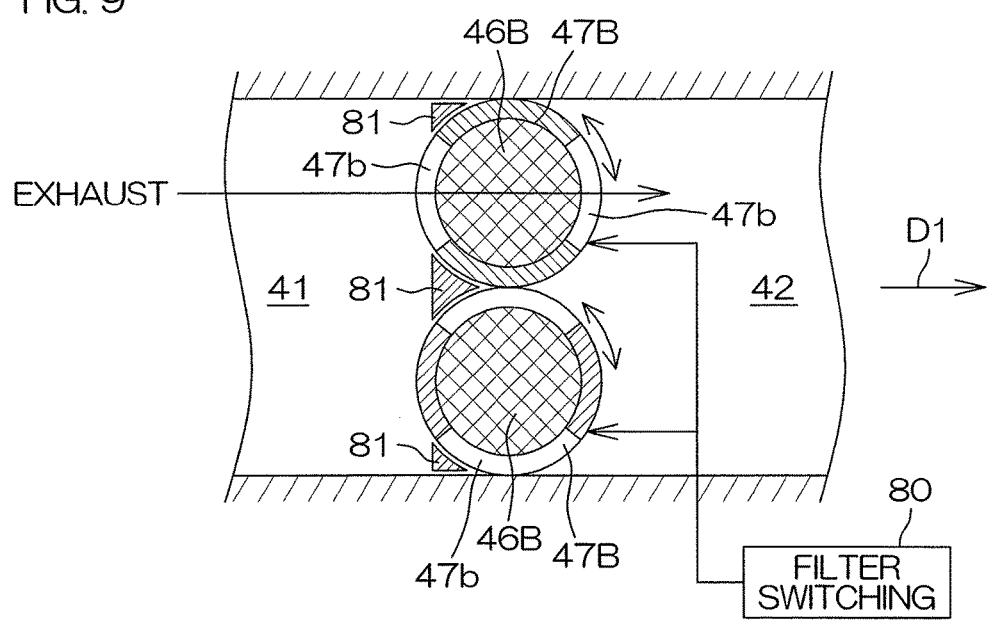

SUBSTRATE PROCESSING DEVICE

CROSS-REFERENCE TO RELATED APPLICATIONS

The present application is a continuation of U.S. patent application Ser. No. 14/652,471, filed Jun. 16, 2015, which is a 35 U.S.C. §§ 371 national phase conversion of PCT/JP2014/053760, filed Feb. 18, 2014, which claims priority to Japanese Patent Application No. 2013-044540, filed Mar. 6, 2013, the contents of both of which are incorporated herein by reference. The PCT International Application was published in the Japanese language.

FIELD OF THE ART

The present invention relates to a substrate processing apparatus including a processing unit that supplies a processing liquid, such as a chemical liquid, etc., to a substrate and a scrubber (gas cleaning apparatus) that cleans exhaust expelled from the processing unit.

Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, substrates for solar cells, etc.

BACKGROUND ART

In a manufacturing process for a semiconductor device or a liquid crystal display, etc., an acidic or alkaline chemical liquid or an organic chemical liquid (a liquid organic solvent) is used to process a substrate, and exhaust containing pollutants, such as chemical liquid components, etc., is thus generated. Such exhaust is removed of the pollutants by a scrubber or other apparatus that cleans the exhaust and is thereafter released to the atmosphere in a harmless state.

For example, Patent Document 1 discloses a semiconductor manufacturing apparatus, which includes a cleaning apparatus that cleans the substrate, a dryer that dries the cleaned substrate by using an organic solvent and a solvent removing apparatus that removes the organic solvent used in the drying process by the dryer and is disposed in the semiconductor manufacturing apparatus. The organic solvent that is contained in exhaust generated in the drying process is removed by a water mist that is injected from a vapor mist injector of the solvent removing apparatus. The exhaust that contains the pollutants is thereby cleaned.

PRIOR ART DOCUMENT

Patent Document

[PATENT DOCUMENT 1] Japanese Patent Application Publication No. 2009-206303

SUMMARY OF THE INVENTION

Problem(s) to be Solved by the Invention

A wet scrubber, which cleans exhaust using a scrubbing liquid, cleans the exhaust by removing or neutralizing pollutants by contact between the exhaust and the scrubbing liquid. To remove the pollutants efficiently from the exhaust, a scrubbing liquid that is specialized to the pollutants contained in the exhaust must be brought in contact with the exhaust. For example, if an alkaline pollutant is contained in the exhaust, it is preferable to bring an acidic scrubbing liquid in contact with the exhaust to cause a neutralization reaction.

In a manufacturing process for a semiconductor device or a liquid crystal display, etc., a plurality of types of chemical liquids, such as an acidic chemical liquid, an alkaline chemical liquid, and an organic chemical liquid, etc., may be supplied to the same substrate. Also, even when one type of chemical liquid is supplied to the substrate, the type of chemical liquid may be changed in accordance with the contents of the process. The type of pollutant contained in the exhaust may thus change during the processing of the substrate or the type of pollutant contained in the exhaust may change in accordance with the contents of the process.

With Patent Document 1, the pollutant contained in the exhaust is limited to one type (IPA (isopropyl alcohol)) and therefore there may be no problem even if the vapor mist injector can inject only one type of scrubbing liquid (water). However, in a case where a plurality of types of chemical liquids are supplied to the substrate or a case where the type of chemical liquid supplied to the substrate is changed according to the contents of the process, it may not be possible to efficiently clean the exhaust generated in accompaniment with the processing of the substrate.

Therefore an object of the present invention is to provide a substrate processing apparatus capable of internally cleaning exhaust generated in accompaniment with processing of a substrate and changing the type of scrubbing liquid, which cleans the exhaust, in accordance with the type of pollutant contained in the exhaust.

Means For Solving The Problem

A preferred embodiment of the present invention provides a substrate processing apparatus including a processing unit that supplies at least one of a plurality of types of chemical liquids to a substrate, a scrubber including an exhaust passage that guides exhaust, generated at the processing unit and containing the chemical liquid, toward an exhaust equipment disposed outside the substrate processing apparatus and a discharger that is able to discharge each of a plurality of types of scrubbing liquids, that clean the exhaust, individually inside the exhaust passage, the scrubber being configured to clear the exhaust by bringing the exhaust flowing through the exhaust passage in contact with the scrubbing liquid, and a controller that selects any one of the plurality of types of scrubbing liquids based on the type of chemical liquid contained in the exhaust and makes the selected scrubbing liquid be discharged from the discharger. The discharger may be a sprayer that sprays the scrubbing liquid to put the scrubbing liquid in a mist state or a shower head that discharges the scrubbing liquid continuously from a plurality of holes.

With this arrangement, at least one of the plurality of types of chemical liquids is supplied to the substrate. Specifically, the processing unit supplies two or more types of chemical liquids to the substrate at mutually different periods or supplies one type of chemical liquid, selected from among the plurality of types of chemical liquids, to the substrate. The type of pollutant (chemical liquid component, etc.) contained in the exhaust may thus change during the processing of the substrate or the type of pollutant contained in the exhaust may change according to the contents of the process.

The exhaust that is generated at the processing unit and contains the chemical liquid is guided toward the exterior of the substrate processing apparatus by the exhaust passage of the scrubber. The discharger of the scrubber can discharge each of the plurality of types of scrubbing liquids individually inside the exhaust passage. The scrubber makes the discharger discharge the scrubbing liquid inside the exhaust passage to bring the exhaust, flowing through the exhaust passage, in contact with the scrubbing liquid. The pollutant is thereby removed from the exhaust and the cleaned exhaust is expelled to the exhaust equipment disposed outside the substrate processing apparatus.

The type of chemical liquid contained in the exhaust changes in accordance with the type of chemical liquid supplied to the substrate by the processing unit. Based on the type of chemical liquid contained in the exhaust, the controller selects the type of scrubbing liquid to be discharged from the discharger. For example, if the type of pollutant contained in the exhaust changes during the processing of the substrate, the controller makes a plurality of types of scrubbing liquids be discharged from the discharger at respectively different periods. Also, if the type of pollutant contained in the exhaust changes in accordance with the contents of the process, the controller changes the type of scrubbing liquid according to each content of the process.

The controller thus selects any one of the plurality of types of scrubbing liquids based on the type of chemical liquid supplied to the substrate and therefore even if the type of pollutant contained in the exhaust changes during the processing of the substrate or the type of pollutant contained in the exhaust changes according to the contents of process, the scrubbing liquid that is specialized to the pollutant contained in the exhaust can be brought in contact with the exhaust. The exhaust generated at the processing unit can thus be cleaned within the substrate processing apparatus and decrease a residual amount of the pollutant contained in the exhaust.

In the preferred embodiment of the present invention, the scrubber further includes a filter that is disposed in the exhaust passage, allows gas flowing through the exhaust passage to pass through the scrubber filter, and retains liquid internally.

With this arrangement, the scrubber filter that allows passage of gas is disposed in the exhaust passage. When the discharger discharges the scrubbing liquid, an atmosphere that contains the scrubbing liquid attaches to the scrubber filter. The scrubbing liquid is thus retained on an outer surface of the scrubber filter and an inner surface of the scrubber filter. The exhaust flowing through the exhaust passage in a flow-through direction toward the exterior of the substrate processing apparatus passes through voids in the interior of the scrubber filter.

In passing through the interior of the scrubber filter, the exhaust that contains the pollutant contacts the scrubbing liquid retained in the scrubber filter. By the scrubbing liquid being retained in the scrubber filter, the scrubbing liquid present inside exhaust passage is increased in surface area so that an area of contact between the exhaust and the scrubbing liquid is also increased. The pollutant is thereby removed efficiently from the exhaust.

In the preferred embodiment of the present invention, the discharger may discharge the scrubbing liquid toward the scrubber filter.

With this arrangement, the scrubbing liquid from the discharger is blown onto the scrubber filter. The scrubbing liquid discharged from the discharger thus hits the scrubber filter directly and the scrubbing liquid is supplied reliably to the scrubber filter. The amount of scrubbing liquid retained by the scrubber filter is thus increased and the exhaust is reliably brought in contact with the scrubbing liquid retained by the scrubber filter. The residual amount of the pollutant contained in the exhaust is thereby decreased further and the cleanliness of the exhaust is improved.

In the preferred embodiment of the present invention, the scrubber may further include a mist filter that is disposed in the exhaust passage at a position further downstream than the discharger and the scrubber filter, allows gas flowing through the exhaust passage to pass through the mist filter, and removes a liquid component from the gas.

With this arrangement, the mist filter that allows passage of gas and removes the liquid component from the gas is disposed in the exhaust passage at the position further downstream than the discharger and the scrubber filter with respect to the exhaust flow-through direction. The exhaust that is decreased in the residual amount of the pollutant by contact with the scrubbing liquid thus passes through the mist filter. The exhaust passing through the mist filter may contain the scrubbing liquid or other liquid component. Such a liquid component is captured by the mist filter and is removed from the exhaust. Therefore, not only the pollutant but the liquid component is also decreased in residual amount in the interior of the substrate processing apparatus.

In the preferred embodiment of the present invention, the scrubber may further include a drain apparatus that expels liquid inside the exhaust passage by making the liquid be suctioned into a drain port that opens inside the exhaust passage.

With this arrangement, a suction force of the drain apparatus is transmitted to the drain port that opens inside the exhaust passage and the liquid inside the exhaust passage is suctioned into the drain port. The liquid inside the exhaust passage is thereby expelled. Because the exhaust that contains the chemical liquid flows into the exhaust passage and the discharger discharges the scrubbing liquid inside the exhaust passage, liquid droplets may attach to an inner surface of the exhaust passage or a pool of liquid may form on a bottom surface (bottom portion of the inner surface) of the exhaust passage. Therefore by the drain apparatus expelling the liquid inside the exhaust passage, the liquid component is suppressed or prevented from mixing in the exhaust, and different types of scrubbing liquid are suppressed or prevented from contacting each other inside the exhaust passage. The cleanliness inside the exhaust passage can thus be improved and the cleanliness of the exhaust can thereby be improved further.

In the preferred embodiment of the present invention, the scrubber may further include a scrubber filter that is disposed in the exhaust passage at a position further upstream than the drain port, allows gas flowing through the exhaust passage to pass through the scrubber filter, and retains liquid internally. In this case, the drain apparatus may include a drain passage passing below the scrubber filter and extending from further upstream than the scrubber filter to the drain port so that the liquid inside the exhaust passage flows toward the drain port.

With this arrangement, the scrubber filter is disposed further upstream than the drain port. The drain apparatus has the drain passage passing through a space between the scrubber filter and the bottom surface of the exhaust passage and extending from further upstream than the scrubber filter to the drain port. A liquid present further upstream than the scrubber filter is guided toward the drain port by the drain passage. The drain apparatus can thus collect liquid from a wider range of the interior of the exhaust passage and the residual amount of the liquid inside the exhaust passage can thereby be decreased.

In the preferred embodiment of the present invention, the scrubber may further include a scrubber filter that is disposed in the exhaust passage, allows gas flowing through the exhaust passage to pass through the scrubber filter, and retains liquid internally. In this case, the discharger may discharge the scrubbing liquid constantly.

With this arrangement, the scrubbing liquid is discharged constantly from the discharger. That is, the discharger continues to discharge the scrubbing liquid while the substrate processing apparatus is in operation. The state in which the scrubbing liquid is retained by the scrubber filter is thus maintained reliably. The exhaust flowing through the exhaust passage is thus reliably brought into contact with the scrubbing liquid retained by the scrubber filter. The residual amount of the pollutant contained in the exhaust can thereby be decreased. Further, when the scrubber filter dries, a resistance that the scrubber filter applies to a gas flow decreases, and therefore by maintaining the scrubber filter in a wet state, fluctuation of exhaust pressure can be decreased. The exhaust pressure transmitted from the exhaust equipment to the processing unit via the scrubber can thereby be stabilized.

In the preferred embodiment of the present invention, the scrubber may further include a scrubber filter that is disposed in the exhaust passage, allows gas flowing through the exhaust passage to pass through the scrubber filter, and retains liquid internally. In this case, the discharger may discharge the scrubbing liquid intermittently.

With this arrangement, the scrubbing liquid is discharged intermittently from the discharger. A consumption amount of the scrubbing liquid can thus be decreased. Also, the scrubbing liquid is supplied intermittently to the scrubber filter and the scrubber filter can thus be prevented from drying completely. The exhaust can thus be cleaned and the exhaust pressure transmitted to the processing unit can be stabilized while decreasing the consumption amount of the scrubbing liquid.

In the case where the discharger discharges the scrubbing liquid intermittently, an interval (time from stoppage to restart of discharge) at which the discharger discharges the scrubbing liquid may be a fixed interval determined in advance or a certain interval set based on a gas pressure in the exhaust passage. For example, the scrubber may further include an exhaust pressure sensor that detects the gas pressure in the exhaust passage and the controller may make the discharger discharge the scrubbing liquid intermittently based on a detection value of the exhaust pressure sensor.

As mentioned above, when the scrubber filter dries, the exhaust resistance of the scrubber filter decreases and the gas pressure inside the exhaust passage thus changes. Specifically, the gas pressure further upstream than the scrubber filter decreases and the gas pressure further downstream than the scrubber filter increases. In other words, the exhaust pressure further upstream than the scrubber filter is strengthened (the absolute value of negative pressure increases) and the gas pressure further downstream than the scrubber filter is weakened (the absolute value of negative pressure decreases). The controller can thus maintain the state in which the scrubber filter is wetted sufficiently while decreasing the consumption amount of the scrubbing liquid by making the discharger discharge the scrubbing liquid intermittently based on the detection value of the exhaust pressure sensor.

In the preferred embodiment of the present invention, the scrubber may further include a plurality of scrubber filters that allow gas flowing through the exhaust passage to pass through the plurality of scrubber filters and retain liquid internally and a filter switching apparatus switching a state of each of the plurality of scrubber filters individually. The filter switching apparatus may switch the state of each of the plurality of scrubber filters individually between a removal state in which the gas inside exhaust passage passes through the scrubber filter and a removal stop state in which the passage of the gas through the scrubber filter is stopped. The controller may select any one of the plurality of scrubber filters based on the type of chemical liquid contained in the exhaust and causes the filter switching apparatus to switch the states of the plurality of scrubber filters by the filter switching apparatus such that the exhaust passes through the selected scrubber filter.

With this arrangement, any one of the plurality of scrubber filters is selected based on the type of chemical liquid supplied to the substrate by the processing unit. The filter switching apparatus switches the states of the plurality of scrubber filters so that the exhaust that is generated at the processing unit and contains the chemical liquid passes through the selected scrubber filter. For example, if the same chemical liquid is supplied to the substrate, the state of each individual scrubber filter is set so that the exhaust passes through the same scrubber filter. Also, when the type of chemical liquid supplied to the substrate is changed, the scrubber filter through which the exhaust passes is also changed. The exhaust that is generated at the processing unit and contains the chemical liquid thus passes through a dedicated scrubber filter that is provided according to the type of chemical liquid. An unpredicted reaction due to mixing of a plurality of chemical liquids can thus be prevented.

In the preferred embodiment of the present invention, the processing unit may include a gas-liquid separator that is disposed further upstream than the scrubber and removes liquid from the exhaust generated at the processing unit.

With this arrangement, the gas-liquid separator disposed further upstream than the scrubber separates liquid from the exhaust generated at the processing unit and removes the liquid component from the exhaust. The exhaust that has been decreased in liquid content by the gas-liquid separator is delivered to the scrubber. Therefore, even if the exhaust generated at the processing unit contains a chemical liquid component, the exhaust is delivered to the scrubber in the state where the content of the chemical liquid has been decreased by the gas-liquid separator. That is, the residual amount of the pollutant is decreased by the gas-liquid separator and the scrubber. The cleanliness of the exhaust expelled from the substrate processing apparatus can thus be improved further.

In the preferred embodiment of the present invention, the processing unit may include a plurality of processing units, each of which supplies at least one of a plurality of types of chemical liquids. In this case, the exhaust passage may include a plurality of individual passages connected respectively to the plurality of processing units and a collection passage extending downstream from each of the plurality of individual passages.

With this arrangement, the plurality of individual passages of the exhaust passage are connected respectively to the plurality of processing units and the collection passage of the exhaust passage is connected to each of the plurality of individual passages. The exhausts generated at the plurality of processing units are expelled from the plurality of processing units into the plurality of individual passages respectively. The exhausts that flowed into the plurality of individual passages are guided via the collection passage toward the exhaust equipment disposed outside the substrate processing apparatus. The exhaust generated at each processing unit is cleaned by contact with the scrubbing liquid in the process of flowing through the exhaust passage. The exhausts generated at the plurality of processing units can thus be cleaned inside the substrate processing apparatus by the scrubber. There is thus no need to provide a plurality of scrubbers in the substrate processing apparatus in correspondence to the individual processing units.

In the preferred embodiment of the present invention, the discharger may include a plurality of dischargers disposed respectively in the plurality of individual passages.

With this arrangement, the plurality of dischargers are disposed respectively in the plurality of individual passages. The scrubber can thus make a scrubbing liquid, of a different type from the scrubbing liquid discharged in a certain individual passage, be discharged in another individual passage. The scrubber can thus bring the exhaust in each individual passage in contact with the scrubbing liquid specialized to the pollutant contained in the exhaust. The scrubber can thereby efficiently remove the pollutants from the exhausts generated at the plurality of processing units.

In the preferred embodiment of the present invention, the scrubber may further include a plurality of scrubber filters that are disposed respectively in the plurality of individual passages, allow gas flowing through the exhaust passage to pass through the plurality of scrubber filters, and retain liquid internally.

With this arrangement, the plurality of scrubber filters are disposed respectively in the plurality of individual passages. The scrubber can thus bring the exhaust and the scrubbing liquid in contact reliably in each individual passage and can increase a time of contact between the exhaust and the scrubbing liquid inside each individual passage. The scrubber can thus efficiently remove the pollutants from the exhausts generated at the plurality of processing units and further improve the cleanliness of the exhausts.

In the preferred embodiment of the present invention, the scrubber may further include a plurality of mist filters that are disposed respectively in the plurality of individual passages at positions further downstream than the plurality of dischargers and the plurality of scrubber filters, allow gas flowing through the exhaust passage to pass through the plurality of mist filters, and remove a liquid component from the gas.

With this arrangement, the plurality of mist filters are disposed respectively in the plurality of individual passages. That is, a dedicated mist filter is provided according to each individual passage. The scrubber can thus remove the liquid component from the exhaust in each individual passage. The scrubber can thus reliably remove the liquid component from the exhausts generated at the plurality of processing units and further improve the cleanliness of the exhausts.

In the preferred embodiment of the present invention, the discharger may be disposed in the collection passage.

With this arrangement, the discharger is disposed in the collection passage. The exhausts expelled from the plurality of processing units flow into the collection passage through the corresponding individual passages and contact the scrubbing liquid, discharged from the discharger, in the collection passage. The exhausts generated at the plurality of processing units are thereby cleaned. The discharger is thus disposed in the collection passage and therefore a discharger does not need to be provided in each individual passage. The substrate processing apparatus can thus be reduced in the number of parts and can be simplified in structure.

In the preferred embodiment of the present invention, the scrubber may further include a scrubber filter that is disposed in the collection passage, allows gas flowing through the exhaust passage to pass through the scrubber filter, and retains liquid internally.

With this arrangement, the scrubber filter is disposed in the collection passage. The exhausts expelled from the plurality of processing units flow into the collection passage through the corresponding individual passages and pass through the scrubber filter in the collection passage. The exhausts generated at the plurality of processing units are thereby brought in contact with the scrubbing liquid reliably. The scrubber filter is thus disposed in the collection passage and therefore a scrubber filter does not need to be provided in each individual passage. The substrate processing apparatus can thus be reduced in the number of parts and the substrate processing apparatus can be simplified in structure.

In the preferred embodiment of the present invention, the scrubber may further include a mist filter that is disposed in the collection passage at a position further downstream than the discharger and the scrubber filter, allows gas flowing through the exhaust passage to pass through the mist filter, and removes a liquid component from the gas.

With this arrangement, the mist filter is disposed in the collection passage. The exhausts expelled from the plurality of processing units flow into the collection passage through the corresponding individual passages and pass through the mist filter in the collection passage. The liquid component is thereby removed from the exhausts. The mist filter is thus disposed in the collection passage and therefore a mist filter does not need to be provided in each individual passage. The substrate processing apparatus can thus be reduced in the number of parts and the substrate processing apparatus can be simplified in structure.

In the preferred embodiment of the present invention, the scrubber may further include a drain apparatus that expels a liquid inside the exhaust passage by making the liquid be suctioned into a drain port that opens inside the collection passage. The drain apparatus may include a plurality of drain passages extending from the plurality of individual passages to the collection passage and inclined with respect to a horizontal plane such that the liquid inside the exhaust passage flows from the plurality of individual passages to the collection passage.

With this arrangement, the plurality of drain passages of the drain apparatus respectively correspond to the plurality of individual passages and each drain passage extends from the corresponding individual passage to the collection passage. The respective drain passages are inclined with respect to the horizontal plane and downstream ends of the drain passages are disposed lower than the upstream ends of the drain passages so that the liquids inside the plurality of individual passages flow through the plurality of drain passages to the collection passage by gravity. The liquids inside the plurality of individual passages are thus collected into the collection passage. The drain apparatus suctions the liquid inside the collection passage from the drain port that opens in the collection passage. The drain apparatus can thus collect liquid from a wider range of the interior of the exhaust passage and the residual amount of the liquid inside the exhaust passage can thereby be decreased.

The above and yet other objects, features, and effects of the present invention shall be made clear by the following description of the preferred embodiments in reference to the attached drawings.

BRIEF DESCRIPTION OF THE DRAWINGS

FIG. 9 is a schematic view of another modification example of the scrubber.

MODES FOR CARRYING OUT THE INVENTION

Figure 1:
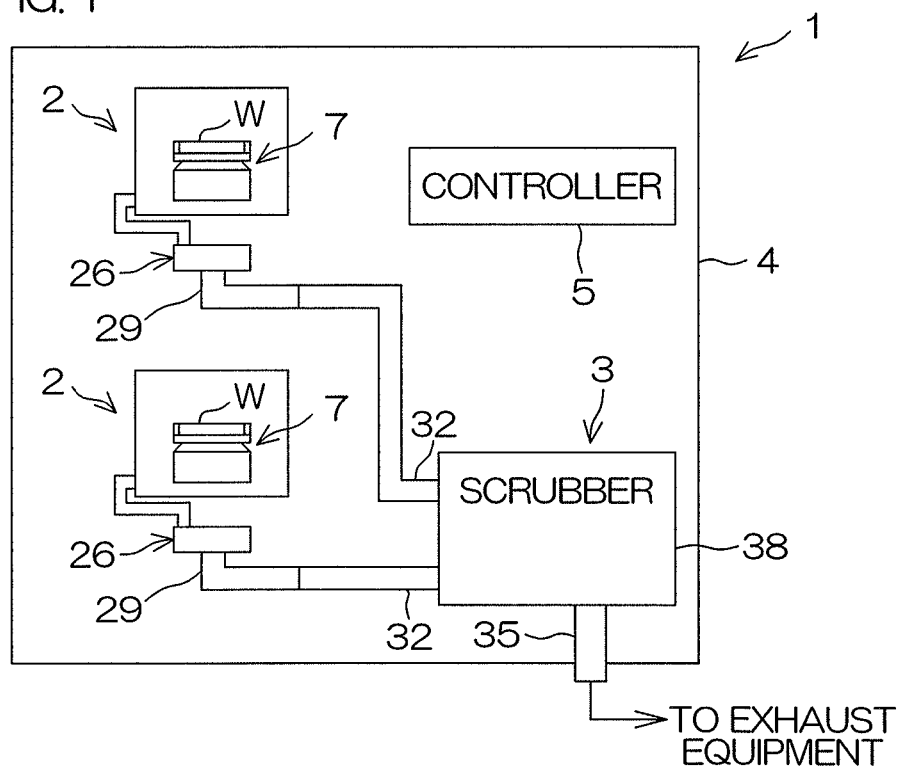
FIG. 1 is a schematic view of the general arrangement of a substrate processing apparatus according to a preferred embodiment of the present invention.
Figure 2:
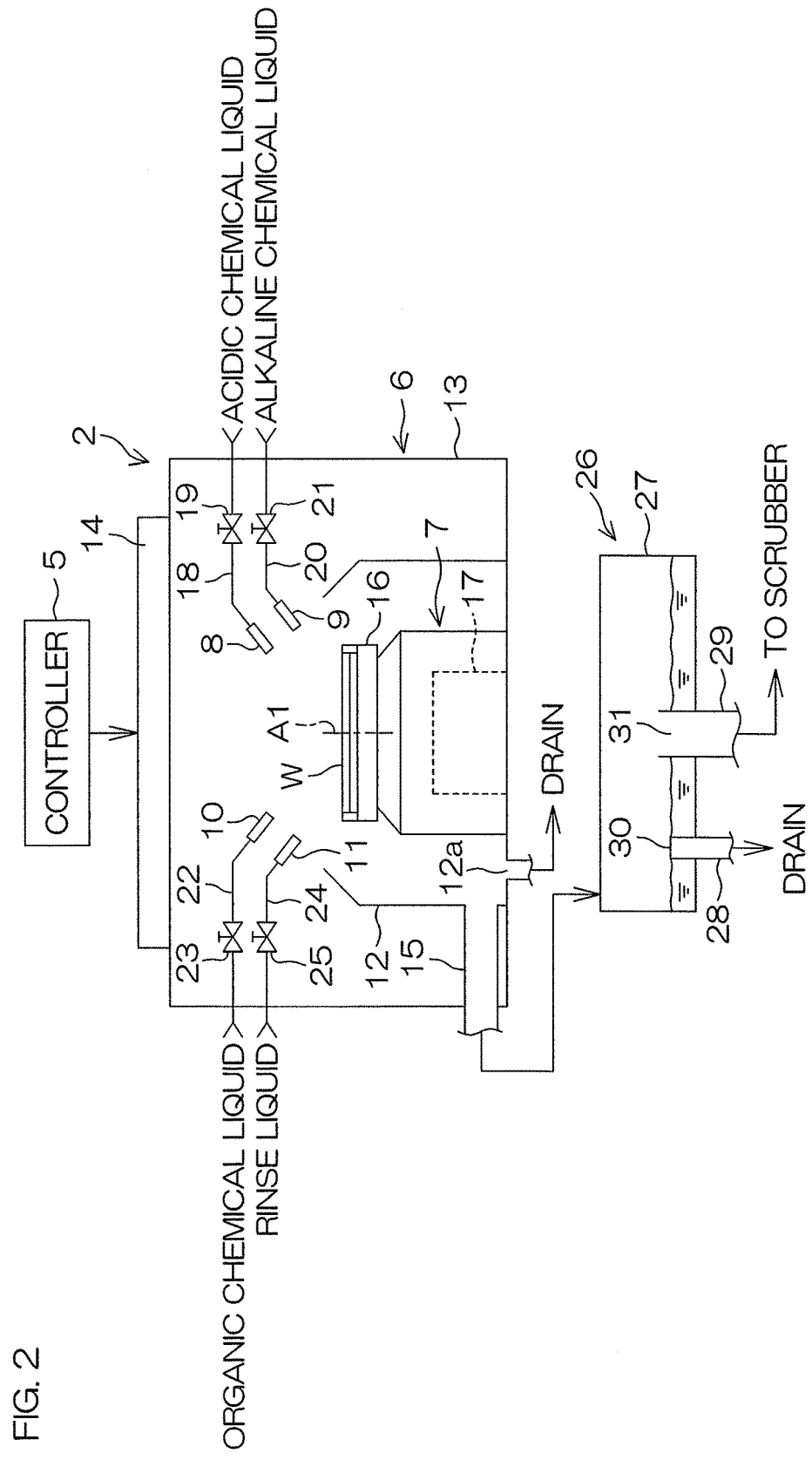
FIG. 2 is a schematic view of the general arrangement of a processing unit.

FIG. 1 is a schematic view of the general arrangement of a substrate processing apparatus 1 according to a preferred embodiment of the present invention. FIG. 2 is a schematic view of the general arrangement of a processing unit 2.

As shown in FIG. 1, the substrate processing apparatus 1 is a single substrate processing type apparatus that processes a disk-shaped substrate W, such as a semiconductor wafer, etc., one by one. The substrate processing apparatus 1 includes a plurality of processing units 2 supplying processing liquids to the substrate W, a scrubber 3 cleaning exhausts expelled from the respective processing units 2, a box-shaped outer wall 4 housing the plurality of processing units 2 and the scrubber 3, and a controller 5 controlling operations of apparatuses and opening and closing of valves provided in the substrate processing apparatus 1.

As shown in FIG. 2, each processing unit 2 is a single substrate processing type unit that processes the substrate W one by one. Each processing unit 2 has an arrangement in common to the other processing units 2. Each processing unit 2 includes a box-shaped chamber 6 having an internal space, a spin chuck 7 holding a single substrate W in a horizontal attitude inside the chamber 6 and rotating the substrate W around a vertical rotation axis Al passing through the center of the substrate W, processing liquid supplying apparatuses 8 toll, each discharging a processing liquid to the substrate W held by the spin chuck 7, and a cylindrical cup 12 surrounding the spin chuck 7.

As shown in FIG. 2, the chamber 6 includes a box-shaped partition wall 13 housing the spin chuck 7, etc., an FFU 14 (fan filter unit) as a blower unit delivering clean air (air filtered by a filter) from an upper portion of the partition wall 13 into the interior of the partition wall 13, and an interior exhaust duct 15 that expels a gas inside the chamber 6 from a lower portion of the partition wall 13. The FFU 14 is disposed above the partition wall 13. The FFU 14 delivers the clean air downward into the chamber 6 from a roof of the partition wall 13. The interior exhaust duct 15 is connected to a bottom portion of the cup 12 and guides the gas inside the chamber 6 toward an exhaust equipment provided in a plant in which the substrate processing apparatus 1 is installed. A down flow (downward flow) that flows downward inside the chamber 6 is thus formed by the FFU 14 and the indoor exhaust duct 15. The down flow is formed not only during a period in which the substrate W is present inside the chamber 6 but in other periods as well.

As shown in FIG. 2, the spin chuck 7 includes a disk-shaped spin base 16 holding the substrate W horizontally and a spin motor 17 rotating the substrate W and the spin base 16 around the rotation axis Al. The spin chuck 7 maybe a clamping type chuck that holds the substrate W horizontally by clamping the substrate W in horizontal directions or may be a vacuum type chuck that suctions a rear surface (lower surface) of the substrate W that is a non-device-forming surface to hold the substrate W horizontally. FIG. 2 shows a case where the spin chuck 7 is a clamping type chuck that clamps the substrate W by a plurality of chuck pins. The cup 12 surrounds the spin base 16. An upper end portion of the cup 12 that opens upward is disposed higher than the spin base 16. A processing liquid, such as a chemical liquid or a rinse liquid, etc., that is expelled to a periphery of the substrate W is received by the cup 12 and is expelled from a drain port 12a that opens in the interior of the cup 12.

As shown in FIG. 2, the processing liquid supplying apparatuses 8 to 11 include an acidic chemical liquid nozzle 8 that discharges an acidic chemical liquid toward the substrate W, an alkaline chemical liquid nozzle 9 that discharges an alkaline chemical liquid toward the substrate W, an organic chemical liquid nozzle 10 that discharges an organic chemical liquid toward the substrate W, and a rinse liquid nozzle 11 that discharges a rinse liquid toward the substrate W. The acidic chemical liquid nozzle 8 maybe a fixed nozzle that discharges the processing liquid toward an upper surface central portion of the substrate W in a state where a discharge port is stationary or may be a scan nozzle that discharges the processing liquid while moving so that a liquid landing position of the processing liquid with respect to the upper surface of the substrate W moves between the central portion and a peripheral edge portion. The same applies to the alkaline chemical liquid nozzle 9, the organic chemical liquid nozzle 10, and the rinse liquid nozzle 11.

As shown in FIG. 2, the processing unit 2 includes an acidic chemical liquid piping 18 connected to the acidic chemical liquid nozzle 8 and an acidic chemical liquid valve 19 interposed in the acidic chemical liquid piping 18. Similarly, the processing unit 2 includes an alkaline chemical liquid piping 20 connected to the alkaline chemical liquid nozzle 9, an alkaline chemical liquid valve 21 interposed in the alkaline chemical liquid piping 20, an organic chemical liquid piping 22 connected to the organic chemical liquid nozzle 10, an organic chemical liquid valve 23 interposed in the organic chemical liquid piping 22, a rinse liquid piping 24 connected to the rinse liquid nozzle 11, and a rinse liquid valve 25 interposed in the rinse liquid piping 24.

When the acidic chemical liquid valve 19 is opened, the acidic chemical liquid from an acidic chemical liquid supply source is discharged toward the upper surface of the substrate W from the acidic chemical liquid nozzle 8. Similarly when any of the alkaline chemical liquid valve 21, the organic chemical liquid valve 23, and the rinse liquid valve 25 is opened, any of the alkaline chemical liquid, the organic chemical liquid, and the rinse liquid is discharged toward the upper surface of the substrate W from any of the alkaline chemical liquid nozzle 9, the organic chemical liquid nozzle 10, and the rinse liquid nozzle 11.

An example of the acidic chemical liquid is hydrofluoric acid and an example of the alkaline chemical liquid is SC-1

(ammonia hydrogen peroxide mixture). An example of the organic chemical liquid is IPA (isopropyl alcohol) and an example of the rinse liquid is pure water (deionized water). The acidic chemical liquid may be an acidic chemical liquid that contains sulfuric acid or hydrochloric acid. The alkaline chemical liquid may be an alkaline chemical liquid that contains TMAH (trimethylphenylammonium hydroxide). The organic chemical liquid is not restricted to IPA and may be another organic chemical liquid, such as HFE (hydrofluoroether), etc. The rinse liquid is not restricted to pure water and may be any of carbonated water, electrolyzed ion water, hydrogen water, ozone water, and aqueous hydrochloric acid solution of dilute concentration (for example, approximately 10 to 100 ppm).

As shown in FIG. 2, the processing unit 2 includes a gas-liquid separator 26 that separates a gas and a liquid contained in a mixed fluid generated inside the processing unit 2. The gas-liquid separator 26 is disposed outside the chamber 6. The gas-liquid separator 26 includes a gas-liquid separation box 27 connected to the interior exhaust duct 15, a liquid piping 28 extending from the interior of the gas-liquid separation box 27 to the exterior of the gas-liquid separation box 27, and a gas piping 29 extending from the interior of the gas-liquid separation box 27 to the exterior of the gas-liquid separation box 27.

As shown in FIG. 2, the gas piping 29 projects upward from a bottom surface of the gas-liquid separation box 27. An end portion of the liquid piping 28 defines a liquid outlet 30 that opens at the gas-liquid separation box 27 bottom surface, and an end portion of the gas piping 29 defines a gas outlet 31 that opens inside the gas-liquid separation box 27 at a height higher than the liquid outlet 30. The gas piping 29 is connected to the scrubber 3 (specifically, the upstream exhaust duct 32 described below). An exhaust generated inside the chamber 6 is thus expelled to the scrubber 3 via the gas-liquid separation box 27 and the gas piping 29.

When the processing liquid is supplied to the substrate W, an exhaust that contains vapor and mist is generated inside the chamber 6. The exhaust (the mixed fluid of the gas and the liquid) flows through the interior exhaust duct 15 and into the gas-liquid separation box 27. The liquid component contained in the exhaust changes to liquid droplets inside the gas-liquid separation box 27 and is drained from the liquid outlet 30. The gas outlet 31 is disposed higher than the liquid outlet 30 and therefore the liquid inside the gas-liquid separation box 27 is unlikely to enter the gas outlet 31. Exhaust that is decreased in a residual amount of the liquid is thus suctioned into the gas outlet 31 and expelled to the scrubber 3.

Figure 3:
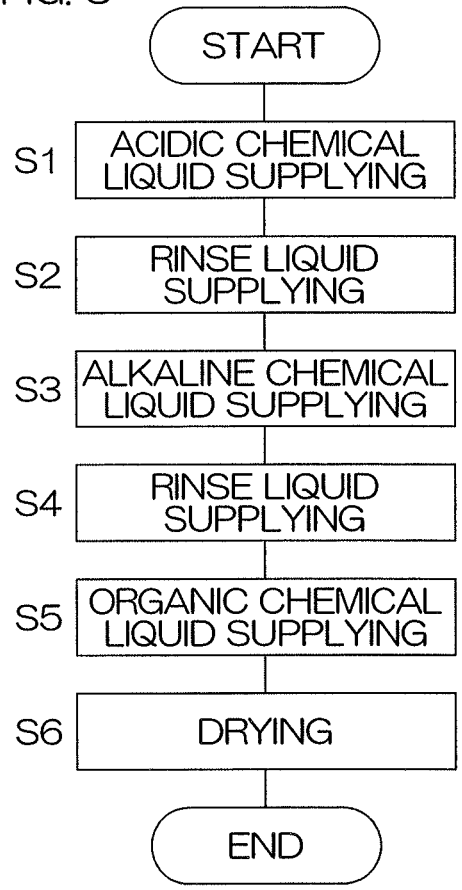
FIG. 3 is a process diagram of an example of processing of a substrate performed by the processing unit.

FIG. 3 is a process diagram of an example of processing of the substrate W performed by the processing unit 2. FIG. 2 and FIG. 3 shall be referenced below.

In a state where the FFU 14 supplies clean air into the chamber 6 and the interior exhaust duct 15 expels the gas inside the chamber 6, that is, in the state where the down flow is formed inside the chamber 6, the controller 5 causes any of the acidic chemical liquid nozzle 8, the alkaline chemical liquid nozzle 9, the organic chemical liquid nozzle 10, and the rinse liquid nozzle 11 to discharge the processing liquid to supply the processing liquid to the substrate W in the rotating state. Specifically, the controller 5 controls a transfer robot (not shown) and makes it transfer the substrate W onto the spin chuck 7. Thereafter, the controller 5 makes the spin chuck 7 start rotating the substrate W.

Next, an acidic chemical liquid supplying step (step S1) of supplying hydrofluoric acid, which is an example of the acidic chemical liquid, to the substrate W is performed. Specifically, the controller 5 opens the acidic chemical liquid valve 19 to make hydrofluoric acid be discharged from the acidic chemical liquid nozzle 8 toward the upper surface central portion of the substrate W while making the spin chuck 7 rotate the substrate W. Hydrofluoric acid is thereby supplied to the upper surface of the substrate W. When a predetermined time elapses from the opening of the acidic chemical liquid valve 19, the controller 5 closes the acidic chemical liquid valve 19 to stop the discharge of hydrofluoric acid.

The hydrofluoric acid, that is discharged from the acidic chemical liquid nozzle 8, is supplied to the upper surface central portion of the substrate W, and spreads outward along the upper surface of the substrate W due to a centrifugal force generated by the rotation of the substrate W. A liquid film of hydrofluoric acid covering the entire upper surface of the substrate W is thereby formed on the substrate Wand hydrofluoric acid is supplied to the entire upper surface of the substrate W. Also, an atmosphere, that contains hydrofluoric acid and is generated in accompaniment with the supplying of hydrofluoric acid to the substrate W and collision of hydrofluoric acid against an inner surface of the cup 12, is expelled from the bottom portion of the cup 12 to the interior exhaust duct 15. An acidic exhaust (a gas containing the acidic chemical liquid) is thereby expelled from the interior of the cup 12.

Next, a first intermediate rinse liquid supplying step (step S2) of supplying pure water, which is an example of the rinse liquid, to the substrate W is performed. Specifically, the controller 5 opens the rinse liquid valve 25 to make pure water be discharged from the rinse liquid nozzle 11 toward the upper surface central portion of the substrate W while making the substrate W rotate. The liquid film of hydrofluoric acid covering the entire upper surface of the substrate W is thereby replaced by pure water and the hydrofluoric acid on the substrate W is rinsed off by the pure water. Also, an atmosphere that contains pure water and is generated in accompaniment with the supplying of pure water to the substrate W, etc., is expelled from the bottom portion of the cup 12 to the interior exhaust duct 15. When a predetermined time elapses from the opening of the rinse liquid valve 25, the controller 5 closes the rinse liquid valve 25 to stop the discharge of pure water.

Next, an alkaline chemical liquid supplying step (step S3) of supplying SC-1, which is an example of the alkaline chemical liquid, to the substrate W is performed. Specifically, the controller 5 opens the alkaline chemical liquid valve 21 to make SC-1 be discharged from the alkaline chemical liquid nozzle 9 toward the upper surface central portion of the substrate W while making the substrate W rotate. The liquid film of pure water covering the entire upper surface of the substrate W is thereby replaced by SC-1 and SC-1 is supplied to the entire upper surface of the substrate W. Also, an atmosphere that contains SC-1 and is generated in accompaniment with the supplying of SC-1 to the substrate W, etc., is expelled from the bottom portion of the cup 12 to the interior exhaust duct 15. An alkaline exhaust (a gas containing the alkaline chemical liquid) is thereby expelled from the interior of the cup 12. When a predetermined time elapses from the opening of the alkaline chemical liquid valve 21, the controller 5 closes the alkaline chemical liquid valve 21 to stop the discharge of SC-1.

Next, a second intermediate rinse liquid supplying step (step S4) of supplying pure water, which is an example of the rinse liquid, to the substrate W is performed. Specifically, the controller 5 opens the rinse liquid valve 25 to make pure water be discharged from the rinse liquid nozzle 11 toward the upper surface central portion of the substrate W while making the substrate W rotate. The liquid film of SC-1 covering the entire upper surface of the substrate W is thereby replaced by pure water and the SC-1 on the substrate W is rinsed off by the pure water. Also, an atmosphere that contains pure water and is generated in accompaniment with the supplying of pure water to the substrate W, etc., is expelled from the bottom portion of the cup 12 to the interior exhaust duct 15. When a predetermined time elapses from the opening of the rinse liquid valve 25, the controller 5 closes the rinse liquid valve 25 to stop the discharge of pure water.

Next, an organic chemical liquid supplying step (step S5) of supplying IPA, which is an example of the organic chemical liquid, to the substrate W is performed. Specifically, the controller 5 opens the organic chemical liquid valve 23 to make IPA be discharged from the organic chemical liquid nozzle 10 toward the upper surface central portion of the substrate W while making the substrate W rotate. The liquid film of pure water covering the entire upper surface of the substrate W is thereby replaced by IPA and the pure water on the substrate W is rinsed off by IPA. Also, an atmosphere that contains IPA and is generated in accompaniment with the supplying of IPA to the substrate W, etc., is expelled from the bottom portion of the cup 12 to the interior exhaust duct 15. An organic exhaust (a gas containing the organic chemical liquid) is thereby expelled from the interior of the cup 12. When a predetermined time elapses from the opening of the organic chemical liquid valve 23, the controller 5 closes the organic chemical liquid valve 23 to stop the discharge of IPA.

Next, a drying step (step S6) of drying the substrate W is performed. Specifically, the controller 5 makes the rotation of the substrate W accelerate to rotate the substrate W at a high rotation speed (for example of several thousand rpm) that is faster than the rotation speed in the acidic chemical liquid supplying step to the organic chemical liquid supplying step. A large centrifugal force is thereby applied to the liquid on the substrate W and the liquid attached to the substrate W is spun off to the periphery of the substrate W. The substrate W is thereby removed of liquid and the substrate W dries. When a predetermined time elapses from the start of high-speed rotation of the substrate W, the controller 5 makes the rotation of the substrate W by the spin chuck 7 stop. Thereafter, the processed substrate W is carried out by the transfer robot from the spin chuck 7.

Figure 4:
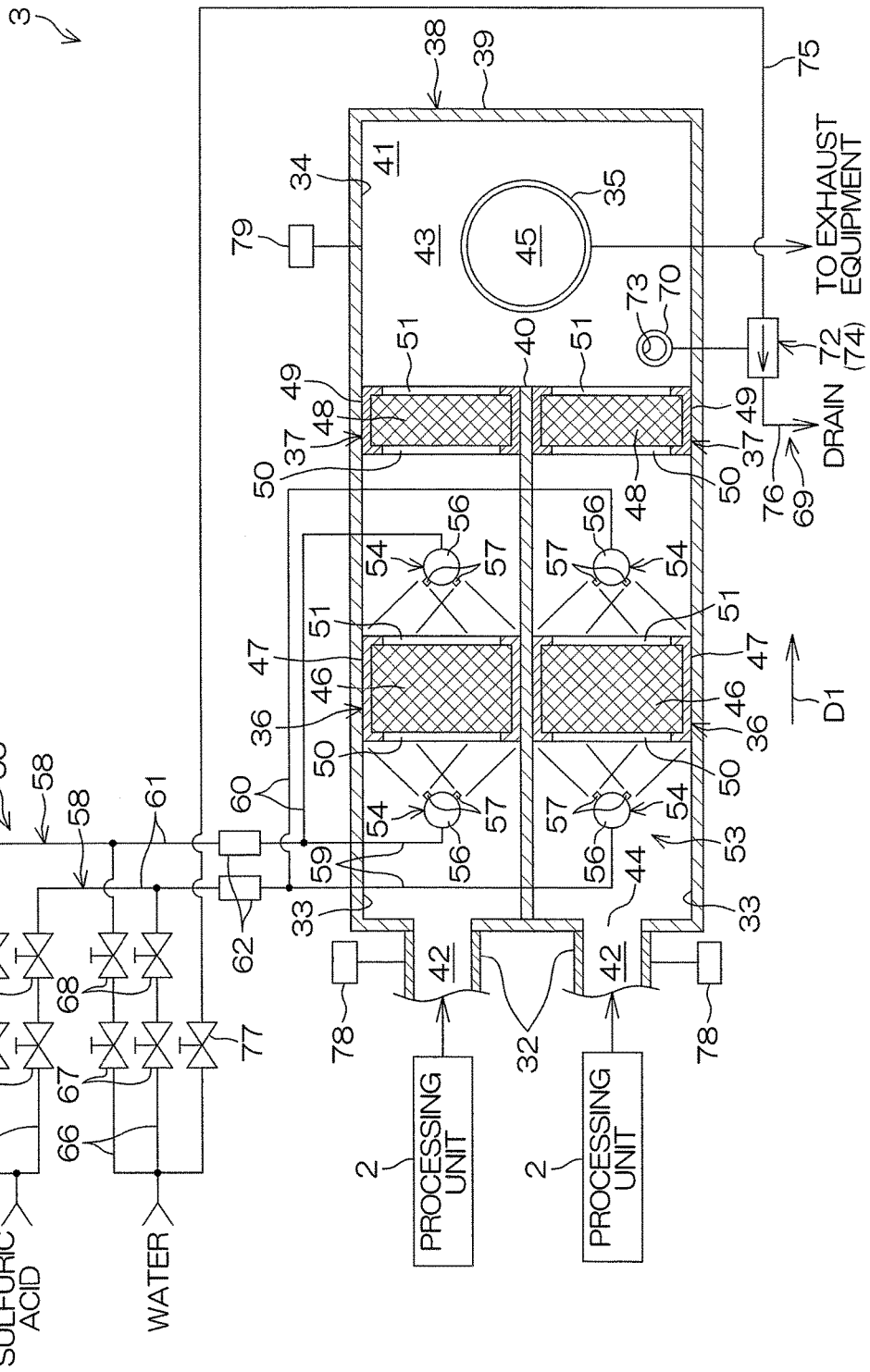
FIG. 4 is a schematic view of the interior of a scrubber as viewed from above.
Figure 5:
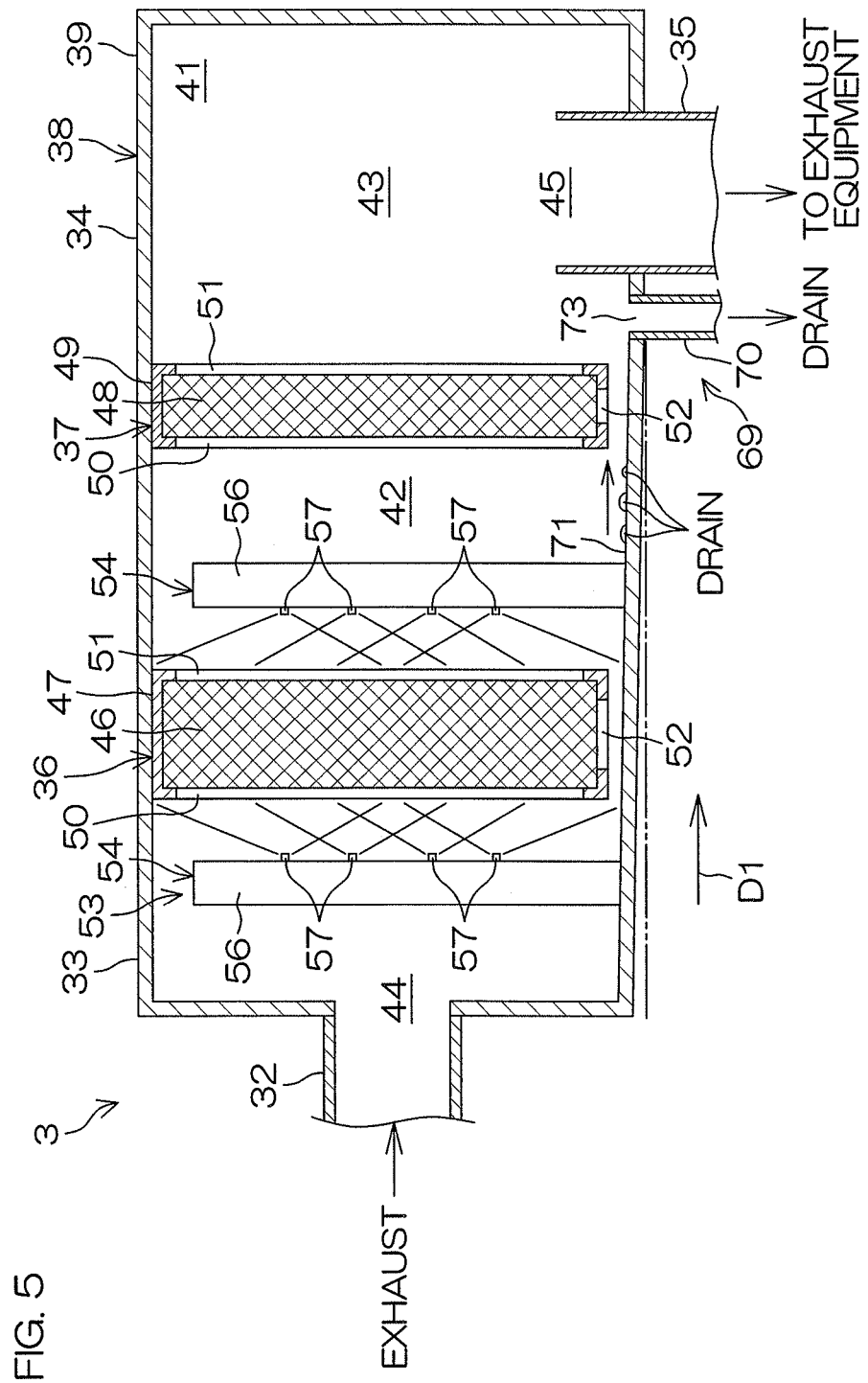
FIG. 5 is a schematic view of the interior of the scrubber as viewed from a side.

FIG. 4 is a schematic view of the interior of the scrubber 3 as viewed from above. FIG. 5 is a schematic view of the interior of the scrubber 3 as viewed from a side.

As shown in FIG. 4, the scrubber 3 includes a plurality of upstream exhaust ducts 33 connected respectively to the plurality of processing units 2, a plurality of exhaust inflow chambers 33 connected respectively to the plurality of upstream exhaust ducts 32, an exhaust collection chamber 34 connected to each of the plurality of exhaust inflow chambers 33, and a downstream exhaust duct 35 connected to the exhaust collection chamber 34. The scrubber 3 further includes a plurality of chemical liquid separators 36 that remove pollutants from the exhausts passing through the exhaust inflow chambers 33 and the exhaust collection chamber 34 to flow from the upstream exhaust ducts 32 toward the downstream exhaust duct 35 and a plurality of mist separators 37 that remove liquid components from the exhausts flowing from the plurality of chemical liquid separators 36 toward the downstream exhaust duct 35.

As shown in FIG. 4, the scrubber 3 includes an exhaust cleaning box 38 connected to the plurality of upstream exhaust ducts 32. The exhaust cleaning box 38 includes a box-shaped housing 39 having an internal space and a partition wall 40 partitioning the interior of the housing 39. The exhaust inflow chambers 33 and the exhaust collection chamber 34 are provided in the interior of the housing 39 and are defined by the housing 39 and the partition wall 40. The exhaust inflow chambers 33 and the exhaust collection chamber 34 are thus defined by a member in common (the exhaust cleaning box 38).

As shown in FIG. 4, the scrubber 3 includes an exhaust passage 41 that guides the exhausts, generated at the plurality of processing units 2, toward the exhaust equipment disposed outside the substrate processing apparatus 1. The exhaust passage 41 includes a plurality of individual passages 42 connected respectively to the plurality of processing units 2 and a collection passage 43 connected to each of the plurality of individual passages 42. Each individual passage 42 extends from the corresponding processing unit 2 to the collection passage 43. The individual passage 42 is defined by the upstream exhaust duct 32, the housing 39, and the partition wall 40 and the collection passage 43 is defined by the housing 39 and the downstream exhaust duct 35. The exhausts generated at the plurality of processing units 2 flow from the plurality of individual passages 42 into the collection passage 43 and are guided to the downstream side (exhaust equipment side) by the collection passage 43.

Each individual passage 42 is a passage through which an exhaust prior to being filtered by a mist filter 48 to be described below flows and the collection passage 43 is a passage through which the exhaust filtered by the mist filter 48 passes. That is, the individual passage 42 and the collection passage 43 are functionally divided in terms of whether or not the exhaust passing through the passage has been filtered by the mist filter 48. On the other hand, the exhaust inflow chamber 33 and the exhaust collection chamber 34 are structurally divided in terms of being or not being partitioned by the partition wall 40. That is, the exhaust inflow chamber 33 is a portion in the exhaust cleaning box 38 that is partitioned by the partition wall 40 and the exhaust collection chamber 34 is a portion in the exhaust cleaning box 38 that is not partitioned by the partition wall 40.

As shown in FIG. 1, the plurality of upstream exhaust ducts 32 are connected respectively to the plurality of gas pipings 29 provided respectively in the plurality of processing units 2. As shown in FIG. 4, each upstream exhaust duct 32 extends from the corresponding processing unit 2 to the corresponding exhaust collection chamber 34. An upstream end of the upstream exhaust duct 32 is connected to the gas piping 29 and a downstream end portion of the upstream exhaust duct 32 is connected to a gas inlet 44 that opens at an inner surface of the exhaust collection chamber 34. The plurality of exhaust inflow chambers 33 are thus connected respectively to the plurality of processing units 2 via the plurality of upstream exhaust ducts 32.

As shown in FIG. 4, the respective exhaust inflow chambers 33 extend in a flow-through direction D1 of the exhaust flowing from the processing units 2 toward the exhaust equipment. The plurality of exhaust inflow chambers 33 are parallel to each other. The exhaust that flows into an exhaust inflow chamber 33 is guided in the flow-through direction D1 by the exhaust inflow chamber 33. A flow passage area (cross-sectional area orthogonal to the flow-through direction D1) of the exhaust inflow chamber 33 is greater than a flow passage area of the upstream exhaust duct 32. An upstream end portion of each exhaust inflow chamber 33 is connected to the corresponding upstream exhaust duct 33 and a downstream end portion of each exhaust inflow chamber 33 is connected to the exhaust collection chamber 34.

As shown in FIG. 4, the exhaust collection chamber 34 is disposed further downstream than all exhaust inflow chambers 33. A flow passage area of the exhaust collection chamber 34 is greater than the flow passage area of the exhaust inflow chamber 33 and greater than a flow passage area of the downstream exhaust duct 35. As shown in FIG. 5, an upstream end portion of the downstream exhaust duct 35 is connected to an opening portion that opens at a bottom surface (bottom portion of the inner surface) of the exhaust collection chamber 34. An upstream end portion of the downstream exhaust duct 35 projects upward from the bottom surface of the exhaust collection chamber 34 and defines an exhaust outlet 45 that opens at a height higher than the bottom surface of the exhaust collection chamber 34. The exhaust collection chamber 34 is connected via the downstream exhaust duct 35 to the exhaust equipment. A suction force of the exhaust equipment is thus transmitted to the exhaust collection chamber 34 via the downstream exhaust duct 35. The suction force of the exhaust equipment is thus transmitted to all processing units 2 via the scrubber 3.

As shown in FIG. 4, each exhaust inflow chamber 33 houses the chemical liquid separator 36 and the mist separator 37. Further, each exhaust inflow chamber 33 houses two sprayers 54 described below. The chemical liquid separator 36 is disposed further upstream in the exhaust flow-through direction D1 than the mist separator 37. The two sprayers 54 are disposed respectively upstream and downstream the chemical liquid separator 36.

As shown in FIG. 4, the chemical liquid separator 36 partitions the internal space of the exhaust inflow chamber 33 into two spaces aligned in the exhaust flow-through direction D1. The space inside the exhaust inflow chamber 33 between the gas inlet 44 and the chemical liquid separator 36 is an upstream cleaning space, and the space inside the exhaust inflow chamber 33 between the chemical liquid separator 36 and the mist separator 37 is a downstream cleaning space. The two sprayers 54 are disposed respectively in the upstream cleaning space and the downstream cleaning space. The mist separator 37 is disposed inside a downstream end portion of the exhaust inflow chamber 33 and partitions the exhaust inflow chamber 33 and the exhaust collection chamber 34. That is, the space further downstream than the mist separator 37 is the interior (exhaust collection space) of the exhaust collection chamber 34.

As shown in FIG. 4, the chemical liquid separator 36 includes a mesh-shaped scrubber filter 46 that allows passage of gas and liquid in the exhaust flow-through direction D1 and a filter case 47 holding the scrubber filter 46. The mist separator 37 includes a mesh-shaped mist filter 48 that allows passage of gas in the exhaust flow-through direction D1 and a mist filter case 49 holding the mist filter 48. The scrubber filter 46 is housed inside the filter case 47 and the mist filter 48 is housed inside the mist filter case 49. The filter case 47 and the mist filter case 49 are mounted to the exhaust cleaning box 38. The chemical liquid separator 36 and the mist separator 37 are thus held by the exhaust cleaning box 38.

As shown in FIG. 4, the filter case 47 includes a plurality of openings connecting the interior of the filter case 47 and the exterior of the filter case 47. The plurality of openings provided in the filter case 47 include an upstream opening 50 disposed further upstream than the scrubber filter 46, a downstream opening 51 disposed further downstream than the scrubber filter 46, and a lower opening 52 (see FIG. 5) disposed below the scrubber filter 46. The scrubber filter 46 is exposed from the plurality of openings provided in the filter case 47. As shown in FIG. 5, a lower surface of the filter case 47 faces a bottom surface (bottom portion of the inner surface) of the exhaust cleaning box 38 across an interval in a vertical direction. The vertical direction interval between the lower surface of the filter case 47 and a bottom surface of the exhaust cleaning box 38 is sufficiently smaller than a height of the chemical liquid separator 36.

In the same manner as in the filter case 47, the mist filter case 49 includes a plurality of openings connecting the interior of the mist filter case 49 and the exterior of the mist filter case 49. The plurality of openings provided in the mist filter case 49 include an upstream opening 50 disposed further upstream than the mist filter 48, a downstream opening 51 disposed further downstream than the mist filter 48, and a lower opening 52 disposed below the mist filter 48. The mist filter 48 is exposed from the plurality of openings provided in the mist filter case 49. A lower surface of the mist filter case 49 faces the bottom surface of the exhaust cleaning box 38 across an interval in the vertical direction. The vertical direction interval between the lower surface of the mist filter case 48 and the bottom surface of the exhaust cleaning box 38 is sufficiently smaller than a height of the mist separator 37.

The scrubber filter 46 has a height equal to that of the mist filter 48 and has a width equal to that of the mist filter 48. As shown in FIG. 4, the scrubber filter 46 is longer in the exhaust flow-through direction D1 than the mist filter 48. The scrubber filter 46 is a coarser filter than the mist filter 48. The scrubber filter 46 thus allows passage of gas and liquid. Also, the mist filter 48 is a finer filter than the scrubber filter 46, allows passage of gas only, and is capable of selectively removing just liquid.

The exhaust that is suctioned into the exhaust inflow chamber 33 from the processing unit 2 by the suction force of the exhaust equipment is supplied to the scrubber filter 46 inside the filter case 47 through the upstream opening 50 of the filter case 47. The exhaust that has passed through the scrubber filter 46 moves from the interior of the filter case 47 to the exterior of the filter case 47 through the downstream opening 51 of the scrubber filter 46. Thereafter, the exhaust that has passed through the chemical liquid separator 36 is supplied to the mist filter 48 inside the mist filter case 49 through the upstream opening 50 of the mist filter case 49. The exhaust that has passed through the mist filter 48 then moves from the interior of the mist filter case 49 to the exterior of the mist filter case 49 through the downstream opening 51 of the mist filter 48. Thereafter, the exhaust that has passed through the mist separator 37 is guided to the exhaust equipment via the downstream exhaust duct 35.

As shown in FIG. 4, the scrubber 3 includes a spraying apparatus 53 that sprays a scrubbing liquid that cleans the exhaust inside the scrubber 3. The spraying apparatus 53 sprays an acidic, alkaline, or neutral scrubbing liquid inside the scrubber 3 in accordance with the type of chemical liquid supplied to the substrate W in the processing unit 2. FIG. 4 shows an arrangement example where each of an acidic scrubbing liquid and a neutral scrubbing liquid is sprayed individually inside the scrubber 3. An example of the acidic scrubbing liquid is dilute sulfuric acid and an example of the neutral scrubbing liquid is water (industrial water). The acidic scrubbing liquid may be an acidic liquid other than dilute sulfuric acid and the neutral scrubbing liquid may be a neutral liquid having water as the main component. As an alkaline scrubbing liquid, a dilute ammonia aqueous solution, etc., may be used.

The spraying apparatus 53 is an apparatus that brings the exhaust, expelled from the processing unit 2, in contact with the mist of the scrubbing liquid to make the mist of the scrubbing liquid capture pollutants contained in the exhaust. As shown in FIG. 4, the spraying apparatus 53 includes the plurality of sprayers 54 that spray the scrubbing liquid inside the scrubber 3 and a scrubbing liquid supplying apparatus 55 that supplies the scrubbing liquids to the respective sprayers 54. The plurality of sprayers 54 are disposed in the interior of the exhaust cleaning box 38. The plurality of sprayers 54 include the plurality of pairs of sprayers 54 disposed respectively in the plurality of exhaust inflow chambers 33. The sprayers 54 of each pair are disposed respectively upstream and downstream the chemical liquid separator 36.

As shown in FIG. 4 and FIG. 5, each sprayer 54 includes a spray column 56 of circular columnar shape disposed inside the exhaust inflow chamber 33 and a plurality of spray nozzles 57 projecting outward from an outer peripheral surface of the spray column 56. The spray column 56 extends in the vertical direction. The plurality of spray nozzles 57 are disposed respectively at different heights and are disposed at two positions separated in a circumferential direction of the spray column 56 in a plan view. A spray port of each spray nozzle 57 faces the chemical liquid separator 36.

Each spray nozzle 57 is connected to a scrubbing liquid flow passage provided in the interior of the spray column 56. The scrubbing liquid supplied from the scrubbing liquid supplying apparatus 55 and through the spray column 56 is sprayed in conical form by each spray nozzle 57. A mist of the scrubbing liquid is thereby made to drift in the interior (the upstream cleaning space and the downstream cleaning space) of the exhaust inflow chamber 33 and the exhaust expelled from the processing unit 2 is brought in contact with the mist of the scrubbing liquid. Further, each spray nozzle 57 sprays the scrubbing liquid toward chemical liquid separator 36 and therefore liquid droplets of the scrubbing liquid are supplied to the outer surface and the inner surface of the scrubber filter 46 and become retained in the interior of the scrubber filter 46. The exhaust passing through the scrubber filter 46 thus also contacts the scrubbing liquid retained by the scrubber filter 46.

As shown in FIG. 4, the scrubbing liquid supplying apparatus 55 includes a plurality of scrubbing liquid supplying units 58 connected respectively to the plurality of pairs of sprayers 54. The plurality of scrubbing liquid supplying units 58 correspond respectively to the plurality of exhaust inflow chambers 33. Each scrubbing liquid supplying unit 58 supplies the scrubbing liquid to the corresponding pair of sprayers 54. Each scrubbing liquid supplying unit 58 can supply the scrubbing liquid to the corresponding pair of sprayers 54 regardless of the operation circumstances of the other scrubbing liquid supplying units 58. Each scrubbing liquid supplying unit 58 is thus independent of the other scrubbing liquid supplying units 58.

As shown in FIG. 4, each scrubbing liquid supplying unit 58 includes an upstream scrubbing liquid piping 59 connected to the sprayer 54 at the upstream side, a downstream scrubbing liquid piping 60 connected to the sprayer 54 at the downstream side, a collection piping 61 connected to the upstream scrubbing liquid piping 59 and the downstream scrubbing liquid piping 60, and an in-line mixer 62 interposed in the collection piping 61. Although unillustrated, the in-line mixer 62 includes a piping interposed in the collection piping 61 and a stirring fin that is disposed inside the piping and is twisted around an axis extending in an axial direction of the piping. A mixed fluid supplied into the in-line mixer 62 (into the piping) is mixed uniformly while flowing spirally along the stirring fin.

As shown in FIG. 4, each scrubbing liquid supplying unit 58 includes an acidic liquid piping 63 connected to the collection piping 61, an acidic liquid valve 64 interposed in the acidic liquid piping 63, and a first flow control valve 65 interposed in the acidic liquid piping 63. Each scrubbing liquid supplying unit 58 further includes a neutral liquid piping 66 connected to the collection piping 61, a neutral liquid valve 67 interposed in the neutral liquid piping 66, and a second flow control valve 68 interposed in the neutral liquid piping 66. An example of an acidic liquid is concentrated sulfuric acid, and an example of a neutral liquid is water. The acidic scrubbing liquid mentioned above is a diluted solution obtained by diluting the acidic liquid with the neutral liquid.

When the acidic liquid valve 64 is opened, the acidic liquid inside the acidic liquid piping 63 flows into the collection piping 61 at a flow rate corresponding to an opening degree of the first flow control valve 65. Similarly, when the neutral liquid valve 67 is opened, the water inside the neutral liquid piping 66 flows into the collection piping 61 at a flow rate corresponding to an opening degree of the second flow control valve 68. Therefore, in a state where the acidic liquid valve 64 is closed and the neutral liquid valve 67 is opened, the water supplied from the neutral liquid piping 66 to the collection piping 61 flows at equal flow rates into the upstream scrubbing liquid piping 59 and the downstream scrubbing liquid piping 60 and is supplied at equal flow rates to the pair of sprayers 54. The water as the neutral scrubbing liquid is thereby sprayed at equal flow rates from the pair of sprayers 54.

Also, in a state where both the acidic liquid valve 64 and the neutral liquid valve 67 are opened, water and concentrated sulfuric acid are supplied to the collection piping 61 at a predetermined ratio (for example, 100 to 1000 (water):1 (concentrated sulfuric acid)). The water and the concentrated sulfuric acid are then mixed inside the piping by the in-line mixer 62. The water and the concentrated sulfuric acid are thereby stirred to form dilute sulfuric acid. The dilute sulfuric acid thus flows at equal flow rates into the upstream scrubbing liquid piping 59 and the downstream scrubbing liquid piping 60 and is supplied at equal flow rates to the pair of sprayers 54. The dilute sulfuric acid as the acidic scrubbing liquid is thereby sprayed at equal flow rates from the pair of sprayers 54.

When the sprayers 54 spray the scrubbing liquid, the mist of the scrubbing liquid disperses in the upstream cleaning space and the downstream cleaning space and the liquid droplets of the scrubbing liquid become retained in the interior of the scrubber filter 46. Due to contact with the scrubbing liquid mist drifting in the upstream cleaning space, the exhaust that flows into the upstream cleaning space from the upstream exhaust duct 32 becomes decreased in the residual amount of the chemical liquid component. Further, the exhaust passing through the scrubber filter 46 becomes decreased in the residual amount of the chemical liquid component due to contact with the scrubbing liquid inside the scrubber filter 46. The exhaust that flows into the downstream cleaning space becomes decreased in the residual amount of the chemical liquid component due to contact with the scrubbing liquid mist drifting in the downstream cleaning space. The exhaust expelled from the processing unit 2 is thereby cleaned.

Also, when the sprayers 54 spray the acidic scrubbing liquid, such as the dilute sulfuric acid, etc., the mist of the acidic scrubbing liquid disperses in the upstream cleaning space and the downstream cleaning space, and the liquid droplets of the acidic scrubbing liquid become retained in the interior of the scrubber filter 46. When an alkaline exhaust expelled from the processing unit 2 flows into the upstream cleaning space in this state, the residual amount of the chemical liquid component in the alkaline exhaust is decreased by neutralization. Similarly, the residual amount of the chemical liquid component is decreased further by the neutralization reaction inside the scrubber filter 46 and the neutralization reaction in the downstream cleaning space. The alkaline chemical liquid contained in the alkaline exhaust is thereby removed and the exhaust expelled from the processing unit 2 is cleaned.

A gas (the exhaust after cleaning; hereinafter referred to as the "cleaned gas") that is decreased in the chemical liquid component due to contact with the scrubbing liquid mist or the scrubbing liquid droplets passes through the mist filter 48 of the mist separator 37. The cleaned gas may contain a liquid component, such as the scrubbing liquid, etc. The mist filter 48 is a finer filter than the scrubber filter 46 and therefore allows passage of just gas and is capable of selectively removing just liquid. Therefore, even if a liquid component is contained in the cleaned gas, the liquid component in the cleaned gas can be removed by the mist filter 48 by passage through the mist filter 48. A cleaned gas (final cleaned gas) that is removed of the liquid component, such as the scrubbing liquid, etc., is thereby guided via the downstream exhaust duct 35 to the exhaust equipment disposed outside the substrate processing apparatus 1.

As shown in FIG. 5, the scrubber 3 includes a drain apparatus 69 that expels liquid from inside the exhaust passage 41. The drain apparatus 69 includes a drain piping 70 connected to the exhaust passage 41 and a drain passage 71 guiding the liquid inside the exhaust passage 41 toward the drain piping 70. As shown in FIG. 4, the drain apparatus 69 further includes a suction apparatus 72 that suctions fluid inside the drain piping 70. The suction apparatus 72 includes an aspirator 74 that suctions the fluid inside the drain piping 70. The suction apparatus 72 may include a pump that suctions the fluid inside drain piping 70 instead of the aspirator 74 or may include both the aspirator 74 and the pump.

As shown in FIG. 5, the drain piping 70 extends downward from the bottom surface of the exhaust collection chamber 34. An upstream end portion of the drain piping 70 is connected to a drain port 73 that opens at the bottom surface (bottom portion of the inner surface) of the exhaust collection chamber 34. As shown in FIG. 4, a downstream end portion of the drain piping 70 is connected to the suction apparatus 72. The drain port 73 is disposed at a periphery of the exhaust outlet 45 in a plan view. An opening area of the drain port 73 is smaller than an opening area of the exhaust outlet 45. As shown in FIG. 5, the upstream end portion of the downstream exhaust duct 35 projects upward from the bottom surface of the exhaust collection chamber 34 and opens at a position higher than the drain port 73. The exhaust outlet 45 is thus disposed higher than the drain port 73. Liquid on the bottom surface of the exhaust collection chamber 34 is thus prevented from entering into the exhaust outlet 45 by the upstream end portion of the downstream exhaust duct 35.

As shown in FIG. 5, the drain passage 71 is constituted by the bottom surface (bottom portion of the inner surface) of the exhaust cleaning box 38. The drain passage 71 extends from a space (the upstream cleaning space) further upstream than the chemical liquid separator 36 to the interior (the exhaust collection space) of the exhaust collection chamber 34. The drain passage 71 includes a gap between a lower surface of the chemical liquid separator 36 and the bottom surface of the exhaust cleaning box 38. Similarly, the drain passage 71 includes a gap between the lower surface of the mist separator 37 and the bottom surface of the exhaust cleaning box 38. The drain passage 71 is inclined with respect to a horizontal plane (alternate long and two short dashes line in FIG. 5) so as to be positioned lower as the drain port 73 is approached. The liquid on the bottom surface of the exhaust cleaning box 38 thus flows by gravity along the bottom surface of the exhaust cleaning box 38 toward the drain port 73. The liquid inside the exhaust inflow chamber 33 and the exhaust collection chamber 34 is thereby guided toward the drain piping 70.

Liquid on the bottom surface of the exhaust inflow chamber 33 is guided toward the drain piping 70 by the drain passage 71. Also, liquid inside the scrubber filter 46 drops downward from the scrubber filter 46. As shown in FIG. 5, the liquid that drops downward from the scrubber filter 46 passes through the lower opening 52 connecting the interior of the filter case 47 and the space below the filter case 47 and lands on the bottom surface of the exhaust inflow chamber 33. Similarly, liquid inside the mist filter 48 passes through the lower opening 52 connecting the interior of the mist filter case 49 and the space below the mist filter case 49 and lands on the bottom surface of the exhaust inflow chamber 33. The liquid that has dropped onto the bottom surface of the exhaust inflow chamber 33 is guided toward the drain piping 70 by the drain passage 71 and is expelled to the drain port 73.

As shown in FIG. 4, the suction apparatus 72 includes the aspirator 74 that suctions the fluid inside the drain piping 70, a liquid supplying piping 75 supplying liquid into the aspirator 74, a liquid expelling piping 76 through which the liquid inside the aspirator 74 is expelled, and a drain valve 77 interposed in the liquid supplying piping 75. The liquid supplying piping 75 is connected to an inflow port of the aspirator 74 into which the liquid flows, and the liquid expelling piping 76 is connected to an outflow port of the aspirator 74 from which the liquid flows out. The drain piping 70 is connected to a suction port of the aspirator 74 that suctions the drain liquid. The liquid supplying piping 75 is connected to a liquid supply source in common to the spraying apparatus 53.

In a state where the drain valve 77 interposed in the liquid supplying piping 75 is opened, water, which is an example of the liquid, flows from the liquid supplying piping 75 to the liquid expelling piping 76 through a T-shaped flow passage (not shown) provided in the interior of the aspirator 74. In this process, a suction force that suctions the fluid inside the drain piping 70 is generated and the drain liquid inside the drain piping 70 flows through the interior of the aspirator 74 and into the liquid expelling piping 76. The drain liquid inside the drain piping 70 is thereby expelled forcibly. Liquid on the bottom surface of the exhaust cleaning box 38 is thus expelled rapidly and reliably into the drain piping 70. Retention of liquid on the bottom surface of the exhaust cleaning box 38 can thus be suppressed or prevented.

As shown in FIG. 4, the scrubber 3 includes a plurality of upstream exhaust pressure sensors 78 detecting an exhaust pressure further upstream than the chemical liquid separator 36 and a downstream exhaust pressure sensor 79 detecting the exhaust pressure further downstream than the chemical liquid separator 36. The plurality of the upstream exhaust pressure sensors 78 correspond respectively to the plurality of processing units 2, and the downstream exhaust pressure sensor 79 corresponds to all processing units 2. The downstream exhaust pressure sensor 79 is connected to the exhaust collection chamber 34. The upstream exhaust pressure sensor 78 is connected to the upstream exhaust duct 32 or the exhaust inflow chamber 33. FIG. 4 shows an example where all upstream exhaust pressure sensors 78 are connected to the upstream exhaust duct 32.

Detection values of the upstream exhaust pressure sensors 78 and the downstream exhaust pressure sensor 79 are input into the controller 5. When the scrubber filter 46 of the chemical liquid separator 36 is wetted sufficiently with the scrubbing liquid, a pressure loss at the scrubber filter 46 is large and a difference between the detection values of the upstream exhaust pressure sensor 78 and the downstream exhaust pressure sensor 79 is large. Therefore based on the detection values of the upstream exhaust pressure sensor 78 and the downstream exhaust pressure sensor 79, the controller 5 can judge whether or not a sufficient amount of the scrubbing liquid is retained by the scrubber filter 46.

Figure 6:
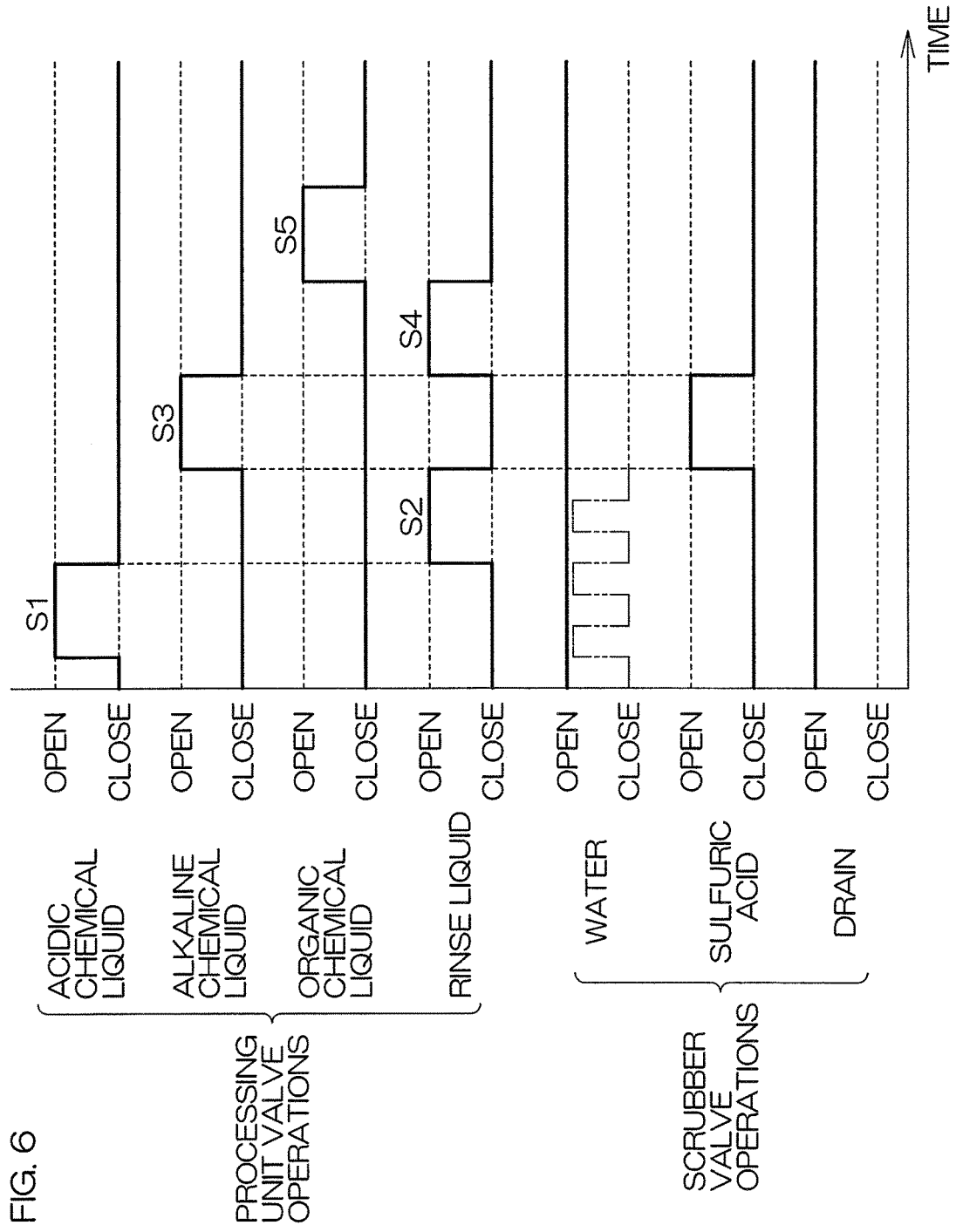
FIG. 6 is a diagram of an example of operation of the scrubber when a substrate is being processed by the processing unit.

FIG. 6 is a diagram of an example of operation of the scrubber 3 when the substrate W is being processed by the processing unit 2.

As mentioned above, at the processing unit 2, the acidic chemical liquid supplying step (step S1), the first intermediate rinse liquid supplying step (step S2), the alkaline chemical liquid supplying step (step S3), the second intermediate rinse liquid supplying step (step S4), the organic chemical liquid supplying step (step S5), and the drying step (step S6) are performed in that order. Each of the acidic chemical liquid valve 19, the alkaline chemical liquid valve 21, the organic chemical liquid valve 23, and the rinse liquid valve 25 is opened and closed in accordance with the step being performed at the processing unit 2.

As shown in FIG. 6, for example, in the acidic chemical liquid supplying step (step S1), the acidic chemical liquid valve 19 is opened, and the alkaline chemical liquid valve 21, the organic chemical liquid valve 23, and the rinse liquid valve 25 are closed. By the changing of the valve that is opened, the acidic chemical liquid supplying step, the first intermediate rinse liquid supplying step, the alkaline chemical liquid supplying step, the second intermediate rinse liquid supplying step, and the organic chemical liquid supplying step are performed successively.

On the other hand, as shown in FIG. 6, at the scrubber 3, regardless of the step being performed at the processing unit 2, that is, during the period from the acidic chemical liquid supplying step to the drying step, the neutral liquid valve 67 corresponding to this processing unit 2 is open and water is discharged (see upper stage of scrubber valve operations). Similarly, the drain valve 77 is open during the period from the acidic chemical liquid supplying step to the drying step (see lower stage of the scrubber valve operations). The neutral liquid valve 67 and the drain valve 77 are thus constantly open. Therefore the sprayers 54 corresponding to the present processing unit 2 constantly spray water as the scrubbing liquid and the drain apparatus 69 constantly expels the liquid on the bottom surface of the exhaust cleaning box 38.

Although not shown, the neutral liquid valve 67 is also open during a period in which processing of the substrate W at the processing unit 2 is not being performed. The sprayers 54 spray the scrubbing liquid toward the chemical liquid separator 36 and while the spraying of water is being performed, the scrubber filter 46 of the chemical liquid separator 36 is maintained in a state of being wetted with water. The difference between the exhaust pressure further upstream than the chemical liquid separator 36 and the exhaust pressure further downstream than the chemical liquid separator 36 is thus maintained fixed. Similarly, all of the neutral liquid valves 67 corresponding to the other processing units 2 are also constantly open. The exhaust pressure applied to each processing unit 2 is thus maintained fixed.

When the acidic chemical liquid supplying step is started at a certain processing unit 2, that is, when the supplying of the acidic chemical liquid to the substrate W is started, the acidic exhaust flows into the exhaust inflow chamber 33 corresponding to this processing unit 2. Similarly, when the alkaline chemical liquid supplying step is started at a certain processing unit 2, the alkaline exhaust flows into the exhaust inflow chamber 33 corresponding to this processing unit 2. Similarly, when the organic chemical liquid supplying step is started at a certain processing unit 2, the organic exhaust flows into the exhaust inflow chamber 33 corresponding to this processing unit 2. At the processing unit 2, the acidic chemical liquid (hydrofluoric acid), the alkaline chemical liquid (SC-1), and the organic chemical liquid (IPA) are supplied to the substrate W and therefore the acidic exhaust, the alkaline exhaust, and the organic exhaust flow respectively at different periods into the exhaust inflow chamber 33.

As shown in FIG. 6, during the period in which the alkaline chemical liquid supplying step (step S3) is being performed at the processing unit 2, the acidic liquid valve 64 of the scrubber 3 is open and dilute sulfuric acid is discharged (see middle stage of the scrubber valve operations). In opening and closing the acidic liquid valve 64 of the scrubber 3, the controller 5 may open the acidic liquid valve 64 at the same time as opening the alkaline chemical liquid valve 21 of the processing unit 2 or may open the acidic liquid valve 64 before or after opening the alkaline chemical liquid valve 21. Similarly, controller 5 may close the acidic liquid valve 64 at the same time as closing the alkaline chemical liquid valve 21 of the processing unit 2 or may close the acidic liquid valve 64 before or after closing the alkaline chemical liquid valve 21.

The exhaust generated at the processing unit 2 flows into the exhaust inflow chamber 33 after elapse of a time that is in accordance with a path length and a flow velocity of the exhaust in the path from the processing unit 2 to the exhaust inflow chamber 33. That is, there is a time difference between the generation of exhaust at the processing unit 2 and the inflow of exhaust into the exhaust inflow chamber 33. The controller 5 may thus delay the timing of opening the acidic liquid valve 64 based on this time difference. Also, even when the supplying of the chemical liquid to the substrate W is stopped, there is residual exhaust containing the chemical liquid inside the processing unit 2 and therefore the exhaust containing the chemical liquid flows into the exhaust inflow chamber 33 for awhile after the supplying of the chemical liquid is stopped. The controller 5 may thus delay the timing of closing the acidic liquid valve 64 based on this time difference.

The sprayers 54 are constantly spraying water as the scrubbing liquid and therefore the acidic exhaust and the organic exhaust that flow into the exhaust inflow chamber 33 are cleaned by contact with the water mist drifting in the exhaust inflow chamber 33 and contact with the water droplets retained by the chemical liquid separator 36. Also, during the period in which the alkaline chemical liquid supplying step is being performed at the processing unit 2, the sprayers 54 spray dilute sulfuric acid as the scrubbing liquid and therefore the alkaline exhaust that flows into the exhaust inflow chamber 33 is cleaned by the neutralization reaction of the pollutant inside the alkaline exhaust and the dilute sulfuric acid. Therefore, even when any of the acidic exhaust, the alkaline exhaust, and the organic exhaust is expelled from the processing unit 2, the exhaust is cleaned to a harmless state by the scrubber 3 and then expelled from the scrubber 3.

As described above, with the present preferred embodiment, the exhaust that is generated at the processing unit 2 and contains the chemical liquid is guided toward the exterior of the substrate processing apparatus 1 by the exhaust passage 41 of the scrubber 3. The sprayers 54 of the scrubber 3 can discharge each of a plurality of types of scrubbing liquids individually inside the exhaust passage 41. The scrubber 3 makes the sprayers 54 discharge the scrubbing liquid inside the exhaust passage 41 to bring the exhaust, flowing through the exhaust passage 41, in contact with the scrubbing liquid. The chemical liquid component is thereby removed from the exhaust and the cleaned exhaust is expelled to the exhaust equipment disposed outside the substrate processing apparatus 1.

Based on the type of chemical liquid contained in the exhaust, the controller 5 selects the type of scrubbing liquid discharged by the sprayers 54. Therefore, even if the type of pollutant contained in the exhaust changes during the processing of the substrate W or the type of pollutant contained in the exhaust changes in accordance with the contents of the process, the controller 5 can bring the scrubbing liquid, which is specialized to the chemical liquid component contained in the exhaust, in contact with the exhaust. The substrate processing apparatus 1 can thus clean, within its interior, the exhaust generated at the processing unit 2 and decrease the residual amount of the chemical liquid component contained in the exhaust.

The exhaust generated at the processing unit 2 can thus be cleaned inside the substrate processing apparatus 1 and therefore an apparatus that removes the pollutant, such as the chemical liquid component, etc., from the exhaust does not need to be provided in the plant in which the semiconductor processing apparatus 1 is installed. In other words, the exhaust that is removed of the chemical liquid component is expelled from the semiconductor processing apparatus 1 and, therefore a user of the semiconductor processing apparatus 1 needs only to prepare a general apparatus for processing the exhaust and does not need to prepare a dedicated apparatus that removes the chemical liquid component from the exhaust.

Also with the present preferred embodiment, the scrubber filter 46 that allows passage of gas is disposed in the exhaust passage 41. When the sprayers 54 discharge the scrubbing liquid, the atmosphere that contains the scrubbing liquid drifts inside the exhaust passage 41 and attaches to the scrubber filter 46. The scrubbing liquid is thus retained on an outer surface of the scrubber filter 46 and an inner surface of the scrubber filter 46. The exhaust flowing through the exhaust passage 41 toward the exterior of the substrate processing apparatus 1 passes through voids in the interior of the scrubber filter 46.

In passing through the interior of the scrubber filter 46, the exhaust that contains the pollutant contacts the scrubbing liquid droplets retained in the scrubber filter 46. By the scrubbing liquid being retained in the scrubber filter 46 in this process, the scrubbing liquid present inside exhaust passage 41 is increased in surface area so that an area of contact between the exhaust and the scrubbing liquid is also increased. A time of contact and the area of contact between the exhaust and the scrubbing liquid are thereby increased and the pollutant is removed efficiently from the exhaust.

Also with the present preferred embodiment, the scrubbing liquid from the sprayers 54 is blown onto the scrubber filter 46. The scrubbing liquid discharged from the sprayers 54 thus hits the scrubber filter 46 directly and the scrubbing liquid is supplied reliably to the scrubber filter 46. The amount of scrubbing liquid retained by the scrubber filter 46 is thus increased and the exhaust is reliably brought in contact with the scrubbing liquid retained by the scrubber filter 46. The residual amount of the pollutant contained in the exhaust is thereby decreased further and the cleanliness of the exhaust is improved.

Also with the present preferred embodiment, the mist filter 48 that allows passage of gas and removes the liquid component from the gas is disposed in the exhaust passage 41 at the position further downstream than the sprayers 54 and the scrubber filter 46 in the exhaust flow-through direction D1. The exhaust that is decreased in the residual amount of the pollutant by contact with the scrubbing liquid thus passes through the mist filter 48. The exhaust passing through the mist filter 48 may contain the scrubbing liquid or other liquid component. Such a liquid component is captured by the mist filter 48 and is removed from the exhaust. Therefore, not only the pollutant but the liquid component is also decreased in residual amount in the interior of the substrate processing apparatus 1.

Also with the present preferred embodiment, the suction force of the drain apparatus 69 is transmitted to the drain port 73 that opens inside the exhaust passage 41 and the liquid inside the exhaust passage 41 is suctioned into the drain port 73. The liquid inside the exhaust passage 41 is thereby expelled. Although the drain port 73 is inside the exhaust passage 41 and is thus in a state of low pressure, the liquid drained from the drain port 73 is suppressed from flowing in reverse to the exhaust passage 41 by the suction force of the drain apparatus 72, and the liquid inside the exhaust passage 41 can thus be drained reliably.

Also with the present preferred embodiment, the scrubber filter 46 is disposed further upstream than the drain port 73. The drain apparatus 69 has the drain passage 71 passing through the space between the scrubber filter 46 and the bottom surface of the exhaust passage 41 and extending from further upstream than the scrubber filter 46 to the drain port 73. A liquid present further upstream than the scrubber filter 46 is guided toward the drain port 73 by the drain passage 71. The drain apparatus 69 can thus collect liquid from a wider range of the interior of the exhaust passage 41 and the residual amount of the liquid inside the exhaust passage 41 can thereby be decreased.

Also with the present preferred embodiment, the scrubbing liquid is discharged constantly from the sprayers 54. That is, all of the sprayers 54 continue to discharge the scrubbing liquid while the substrate processing apparatus 1 is in operation. The state in which the scrubbing liquid is retained by the scrubber filter 46 is thus maintained reliably. The exhaust flowing through the exhaust passage 41 is thus reliably brought into contact with the scrubbing liquid retained by the scrubber filter 46. The residual amount of the pollutant contained in the exhaust can thereby be decreased. Further, when the scrubber filter 46 dries, a resistance that the scrubber filter 46 applies to a gas flow decreases, and therefore by maintaining the scrubber filter 46 in a wet state, fluctuation of exhaust pressure can be decreased. The exhaust pressure transmitted from the exhaust equipment to the processing unit 2 via the scrubber 3 can thereby be stabilized.

When the exhaust pressure transmitted to the processing unit 2 fluctuates, disturbance of gas flow may occur inside the chamber 6. By stabilizing the exhaust pressure transmitted to the processing unit 2, the gas flow inside the chamber 6 can be stabilized. Attachment of foreign matter, such as particles, etc., and attachment of a mist of the processing liquid to the substrate W inside the chamber 6 can thus be suppressed or prevented. The cleanliness of the substrate W can thus be improved. Further, when the respective sprayers 54 discharge the scrubbing liquid constantly, the exhaust pressures transmitted to the respective processing units 2 are made uniform to enable variation of processing quality of the substrate W among the plurality of processing units 2 to be decreased.

Also with the present preferred embodiment, the gas-liquid separator 26 that is disposed further upstream than the scrubber 3 separates liquid from the exhaust generated at the processing unit 2 and removes the liquid component from the exhaust. The exhaust that has been decreased in liquid content by the gas-liquid separator 26 is delivered to the scrubber 3. The amount of the chemical liquid component to be removed at the scrubber 3 can thus be decreased and consequently, the cleanliness of the exhaust expelled from the substrate processing apparatus 1 can be improved further.

Also with the present preferred embodiment, the plurality of individual passages 42 of the exhaust passage 41 are connected respectively to the plurality of processing units 2 and the collection passage 43 of the exhaust passage 41 is connected to each of the plurality of individual passages 42. The exhausts generated at the plurality of processing units 2 are expelled from the plurality of processing units 2 into the plurality of individual passages 42 respectively. The exhausts that flowed into the plurality of individual passages 42 are guided via the collection passage 43 toward the exhaust equipment disposed outside the substrate processing apparatus 1. The exhaust generated at each processing unit 2 is cleaned by contact with the scrubbing liquid in the process of flowing through the exhaust passage 41. The exhausts generated at the plurality of processing units 2 can thus be cleaned inside the substrate processing apparatus 1 by the scrubber 3. There is thus no need to provide a plurality of scrubbers 3 in the substrate processing apparatus 1 in correspondence to the individual processing units 2.

Also with the present preferred embodiment, the plurality of sprayers 54 are disposed respectively in the plurality of individual passages 42. The scrubber 3 can thus make a scrubbing liquid, of a different type from the scrubbing liquid discharged in a certain individual passage 42, be discharged in another individual passage 42. The scrubber 3 can thus bring the exhaust in each individual passage 42 in contact with the scrubbing liquid specialized to the pollutant contained in the exhaust. Therefore even in a case where different processes are preformed respectively in the plurality of processing units 2, the scrubber 3 can perform removal of the respectively corresponding chemical liquid components.

Also with the present preferred embodiment, the plurality of scrubber filters 46 are disposed respectively in the plurality of individual passages 42. The scrubber 3 can thus bring the exhaust and the scrubbing liquid in contact reliably in each individual passage 42 and can increase the area of contact between the exhaust and the scrubbing liquid inside each individual passage 42. The scrubber 3 can thus efficiently remove the pollutants from the exhausts generated at the plurality of processing units 2 and further improve the cleanliness of the exhausts.

Also with the present preferred embodiment, the plurality of mist filters 48 are disposed respectively in the plurality of individual passages 42. That is, a dedicated mist filter 48 is provided according to each individual passage 42. The scrubber 3 can thus remove the liquid component from the exhaust in each individual passage 42. The scrubber 3 can thus reliably remove the liquid component from the exhausts generated at the plurality of processing units 2 and further improve the cleanliness of the exhausts.

Also with the present preferred embodiment, the plurality of drain passages 71 of the drain apparatus 69 respectively correspond to the plurality of individual passages 42 and each drain passage 71 extends from the corresponding individual passage 42 to the collection passage 43. The respective drain passages 71 are inclined with respect to the horizontal plane and the downstream ends of the drain passages 71 are disposed lower than the upstream ends of the drain passages 71 so that the liquids inside the plurality of individual passages 42 flow through the plurality of drain passages 71 to the collection passage 43 by gravity. The liquids inside the plurality of individual passages 42 are thus collected into the collection passage 43. The drain apparatus 69 suctions the liquid inside the collection passage 43 from the drain port 73 that opens in the collection passage 43. The drain apparatus 69 can thus collect liquid from a wider range of the interior of the exhaust passage 41 and the residual amount of the liquid inside the exhaust passage 41 can thereby be decreased.

Although the preferred embodiment of the present invention has been described above, the present invention is not restricted to the contents of the above-described preferred embodiment and various modifications are possible within the scope of the claims.

Figure 7:
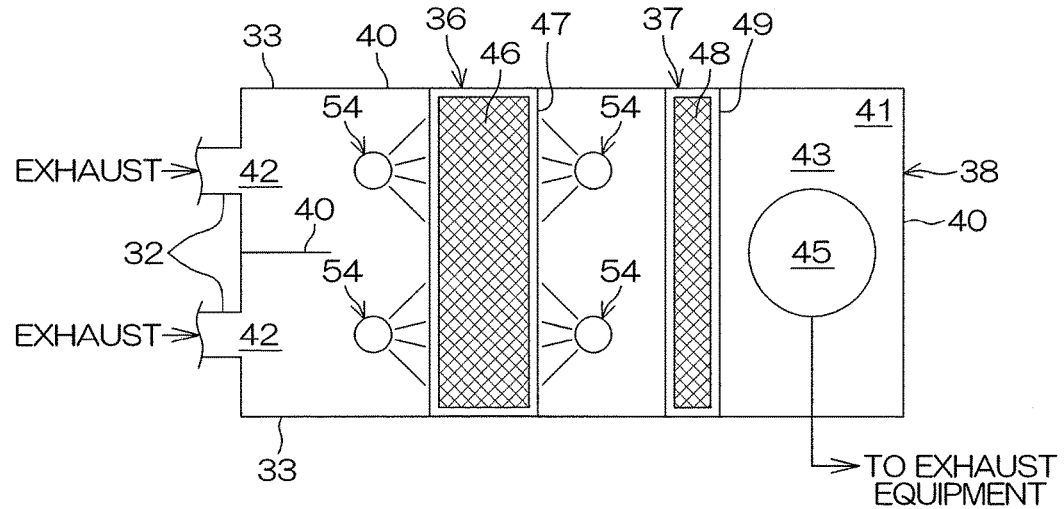
FIG. 7 is a schematic view of a modification example of the scrubber.

For example, although with the above-described preferred embodiment, the case where the sprayers 54 are disposed in each individual passage 42 was described, the sprayers 54 may instead be disposed in the collection passage 43 as shown in FIG. 7. In this case, not only the sprayers 54 but the scrubber filter 46 and the mist filter 48 may also be disposed in the collection passage 43 as shown in FIG. 7.

In the case where the sprayers 54 are disposed in the collection passage 43, the sprayers 54 do not have to be provided in each of the individual passages 42. The substrate processing apparatus 1 can thus be reduced in the number of parts and the substrate processing apparatus 1 can be simplified in structure. Similarly, in the case where the scrubber filter 46 and the mist filter 48 are disposed in the collection passage 43, the scrubber filter 46 and the mist filter 48 do not have to be provided in each of the individual passages 42. The substrate processing apparatus 1 can thus be reduced in the number of parts and the substrate processing apparatus 1 can be simplified in structure.

Also, although with the preferred embodiment, the case where the sprayers 54 discharge the scrubbing liquid constantly was described, the sprayers 54 may discharge the scrubbing liquid intermittently as indicated by alternate long and two short dashes lines in FIG. 6. By the scrubbing liquid thus being discharged intermittently from the sprayers 54, a consumption amount of the scrubbing liquid can be decreased.

In the case where the sprayers 54 discharge the scrubbing liquid intermittently, an interval (time from stoppage to restart of discharge) at which the sprayers 54 discharge the scrubbing liquid may be a fixed interval determined in advance or a certain interval set based on a gas pressure in the exhaust passage 41.

Specifically, the controller 5 may make the sprayers 54 discharge the scrubbing liquid intermittently based on the detection value or values of either or both of the upstream exhaust pressure sensors 78 and the downstream exhaust pressure sensor 79. When the scrubber filter 46 dries, the exhaust resistance of the scrubber filter 46 decreases and therefore the gas pressure in the upstream exhaust duct 32 decreases (the absolute value of negative pressure increases) and the gas pressure inside the exhaust collection chamber 34 increases (the absolute value of negative pressure decreases). The controller 5 can thus maintain the state in which the scrubber filter 46 is wetted sufficiently while decreasing the consumption amount of the scrubbing liquid by making the sprayers 54 discharge the scrubbing liquid intermittently based on the detection value or values of either or both of the upstream exhaust pressure sensors 78 and the downstream exhaust pressure sensor 79.

Further, the suction force of the exhaust equipment is transmitted to each processing unit 2 via the scrubber filter 46 and therefore the controller 5 can adjust the exhaust pressure transmitted to the processing unit 2 by controlling the supplying of scrubbing liquid to the scrubber filter 46. Therefore by controlling the supplying of scrubbing liquid to the respective scrubber filters 46 based on the detection value or values of either or both of the upstream exhaust pressure sensors 78 and the downstream exhaust pressure sensor 79, the controller 5 can decrease exhaust pressure differences among the plurality of processing units 2. The controller 5 can thus make uniform the exhaust pressures inside the respective processing units 2.

Also, although with the preferred embodiment, the case where the plurality of scrubber filters 46 are disposed respectively in the plurality of individual passages 42 was described, the scrubber 3 may instead include a plurality of scrubber filters 46 corresponding to an individual passage 42 in common and a filter switching apparatus 80 that switches the state of each of the plurality of scrubber filters 46 individually.

Figure 8:
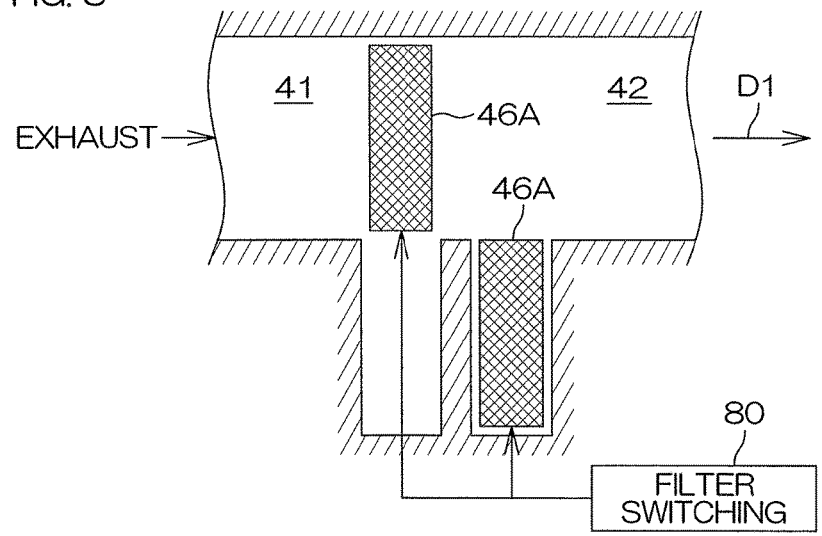
FIG. 8 is a schematic view of a modification example of the scrubber.

Specifically, as shown in FIG. 8 and FIG. 9, the plurality of scrubber filters 46 provided according to the respective types of chemical liquids (for example, a scrubber filter 46 for the acidic chemical liquid and a scrubber filter 46 for the alkaline chemical liquid) and the filter switching apparatus 80 that switches the state of each of the plurality of scrubber filters 46 individually may be associated with a single individual passage 42. Similarly, although the case where the single scrubber filter 46 is disposed in the collection passage 43 was described with FIG. 7, the plurality of scrubber filters 46 and the filter switching apparatus 80 may be associated with the collection passage 43.

Each of scrubber filters 46A of cubical shapes shown in FIG. 8 is switched between a removal state in which the gas inside exhaust passage 41 passes through the scrubber filter 46A and a removal stop state in which the passage of the gas through the scrubber filter 46A is stopped. The removal state is a state in which the scrubber filter 46A is disposed at a removal position (position of the scrubber filter 46A at the left side) inside the exhaust passage 41 and the removal stop state is a state in which the scrubber filter 46A is disposed at a removal stop position (position of the scrubber filter 46A at the right side) outside the exhaust passage 41. The filter switching apparatus 80 can thus switch the scrubber filter 46A that removes the pollutant from the exhaust by moving the scrubber filters 46A between the removal position and the removal stop position.

Also, each of scrubber filters 46B of circular columnar shapes shown in FIG. 9 is disposed in the exhaust passage 41 in an attitude where a center line of the scrubber filter 46B is orthogonal to the exhaust flow-through direction D1. The plurality of scrubber filters 46B are aligned in a direction orthogonal to the exhaust flow-through direction D1 and an axial direction of each scrubber filter 46B. Each scrubber filter 46B is housed inside a filter case 47B of circular cylindrical shape having an outer peripheral portion provided with two opening portions 47b that face each other in a diameter direction. The filter switching apparatus 80 rotates the filter case 47B around its center line between a removal position at which the two opening portions 47b are open (position of the scrubber filter 46B at the upper side) and a removal stop position at which the two opening portions 47b are closed by a shielding member 81 disposed inside the exhaust passage 41 (position of the scrubber filter 46B at the lower side).

As shown in FIG. 9, when the filter case 47B is disposed at the removal position (position of the scrubber filter 46B at the upper side), the scrubber filter 46B is switched to a removal state in which the gas inside exhaust passage 41 passes through the scrubber filter 46B. When the filter case 47B is disposed at the removal stop position (position of the scrubber filter 46B at the lower side), the scrubber filter 46B is switched to a removal stop state in which the passage of the gas through the scrubber filter 46B is stopped. The filter switching apparatus 80 can thus switch the scrubber filter 46B that removes the pollutant from the exhaust by rotating the filter cases 47B.

Also, although with the preferred embodiment, the case where the scrubber filter 46 and the mist filter 48 are disposed in each of all individual passages 42 was described, the scrubber filter 46 and the mist filter 48 may be disposed in just a portion of the individual passages 42. Also, at least one of either of the scrubber filter 46 and the mist filter 48 may be omitted from all of the individual passages 42. Similarly, although with FIG. 7, the case where the scrubber filter 46 and the mist filter 48 are disposed in the collection passage 43 was described, at least one of either of the scrubber filter 46 and the mist filter 48 may be omitted from the collection passage 43. In this case, the chemical liquid component contained in the exhaust is removed only by the scrubbing liquid discharged from the sprayers 54. Although the area of contact between the scrubbing liquid and the chemical liquid component is decreased, the structure can be simplified.

Also, although with the preferred embodiment, the case where the liquid inside the exhaust passage 41 is expelled from one location (the drain port 73) was described, the liquid inside the exhaust passage 41 may instead be expelled from a plurality of drain ports 73. For example, a plurality of drain ports 73 corresponding respectively to the plurality of sprayers 54 may be provided inside the exhaust passage 41. In this case, the gap between the lower surface of the chemical liquid separator 36 and the bottom surface of the exhaust cleaning box 38 does not have to be provided and the chemical liquid separator 36 may be in contact with the bottom surface of the exhaust cleaning box 38. That is, the chemical liquid separator 36 may partition the exhaust passage 41 into an upstream side and a downstream side completely. The same applies to the mist separator 37.

Also, although with the preferred embodiment, the case where the liquid inside the exhaust passage 41 is expelled into the drain piping 70 in common was described, the drain piping 70 may be switched in accordance with the type of scrubbing liquid discharged from the sprayers 54. Specifically, a plurality of drain pipings 70 and a plurality of drain valves 77 may be provided. In this case, the controller 5 can switch the drain piping 70 in accordance with the type of scrubbing liquid discharged from the sprayers 54 by switching the plurality of drain valves 77.

Also, although with the preferred embodiment, the case where the sprayers 54 discharge each of two types of scrubbing liquids (the acidic scrubbing liquid and the neutral scrubbing liquid) individually was described, the sprayers 54 may instead discharge each of three types of scrubbing liquids (an acidic scrubbing liquid, an alkaline scrubbing liquid, and a neutral scrubbing liquid) individually or may discharge each of two types of scrubbing liquids, besides a combination of the acidic scrubbing liquid and the neutral scrubbing liquid, individually. Also, in a case where each of an acidic scrubbing liquid and an alkaline scrubbing liquid is discharged individually from a sprayer 54 in common, the controller 5 may make a neutral scrubbing liquid be discharged from the sprayer 54 before switching the scrubbing liquid from one to the other of the acidic scrubbing liquid and the alkaline scrubbing liquid. In this case, the controller 5 can rinse the interior of the sprayer 54 and the interior of the piping with the neutral scrubbing liquid and mixing of the acidic scrubbing liquid and the alkaline scrubbing liquid can thus be prevented.

Also, although with the preferred embodiment, the case where each sprayer 54 includes the plurality of spray nozzles 57 and the plurality of types of scrubbing liquids (the acidic scrubbing liquid and the neutral scrubbing liquid) are discharged from the spray nozzles 57 in common was described, the plurality of types of scrubbing liquids may instead be discharged from separate spray nozzles 57. For example, a dedicated spray nozzle 57 may be provided for each type of scrubbing liquid.

Also, although with the preferred embodiment, the case where two processing units 2 are provided in the substrate processing apparatus 1 was described, the number of processing units 2 may be one or may be not less than three.

Also, although with the preferred embodiment, the case where each processing unit 2 is a single substrate processing type unit that processes the substrate W one by one was described, the processing unit 2 may be a batch type unit that processes a plurality of substrates W in a batch. That is, the substrate processing apparatus 1 may be a batch type apparatus.

Also, although with the preferred embodiment, the case where the substrate processing apparatus 1 is an apparatus that processes the disk-shaped substrate W was described, the substrate processing apparatus 1 may instead be an apparatus that processes a polygonal substrate W, such as a substrate for liquid crystal display device, etc.

While a preferred embodiment of the present invention has been described in detail above, this is merely a specific example used to clarify the technical contents of the present invention, and the present invention should not be interpreted as being limited only to this specific example, and the spirit and scope of the present invention shall be limited only by the appended claims.

The present application corresponds to Japanese Patent Application No. 2013-44540 filed on Mar. 6, 2013 in the Japan Patent Office, and the entire disclosure of this application is incorporated herein by reference.

DESCRIPTION OF THE SYMBOLS

1: Substrate processing apparatus
2: Processing unit
3: Scrubber
5: Controller
26: Gas-liquid separator
27: Gas-liquid separation box
28: Liquid piping
29: Gas piping
32: Upstream exhaust duct
33: Exhaust inflow chamber
34: Exhaust collection chamber
35: Downstream exhaust duct
36: Chemical liquid separator
37: Mist separator
38: Exhaust cleaning box
41: Exhaust passage
42: Individual passage
43: Collection passage
44: Gas inlet
45: Exhaust outlet
46: Scrubber filter
46A: Scrubber filter
46B: Scrubber filter
47: Filter case
47B: Filter case
48: Mist filter
49: Mist filter case
50: Upstream opening
51: Downstream opening
52: Lower opening
53: Spraying apparatus
54: Sprayer (discharger)
55: Scrubbing liquid supplying apparatus
56: Spray column
57: Spray nozzle
69: Drain apparatus
70: Drain piping
71: Drain passage
72: Suction apparatus
73: Drain port
74: Aspirator
78: Upstream exhaust pressure sensor
79: Downstream exhaust pressure sensor
80: Filter switching apparatus
81: Shielding member
D1: Flow-through direction
W: Substrate

What is claimed is:

1. A substrate processing method comprising:
a processing step of causing a processing unit included in a substrate processing apparatus to supply a plurality of types of chemical liquids to at least one substrate;
a gas guiding step of causing an exhaust passage included in the substrate processing apparatus to guide exhaust gas generated at the processing unit and containing one of the plurality of types of chemical liquids toward an exhaust equipment disposed outside the substrate processing apparatus;
a liquid selecting step of selecting any one of a plurality of types of scrubbing liquids to be discharged from a discharger included in the substrate processing apparatus and disposed in the exhaust passage based on the type of chemical liquid contained in the exhaust gas; and
a discharging step of causing the discharger to discharge the selected scrubbing liquid of the type selected in the liquid selecting step so as to bring the exhaust gas flowing through the exhaust passage in contact with the selected scrubbing liquid.

2. The substrate processing method according to claim 1, further comprising:
a contacting step of causing gas flowing through the exhaust passage to pass through a scrubber filter disposed in the exhaust passage and to come into contact with the scrubbing liquid held by the scrubber filter.

3. The substrate processing method according to claim 2, wherein
the discharging step includes a step of causing the discharger to discharge the selected scrubbing liquid toward the scrubber filter disposed in the exhaust passage.

4. The substrate processing method according to claim 2, further comprising:
a mist-removing step of causing gas flowing through the exhaust passage to pass through a mist filter disposed downstream of the discharger and the scrubber filter in the exhaust passage, and causing the mist filter to remove liquid component contained in the gas.

5. The substrate processing method according to claim 1, further comprising:
an expelling step of causing a drain port that opens inside the exhaust passage to suck liquid inside the exhaust passage so as to expel the liquid inside the exhaust passage.

6. The substrate processing method according to claim 5, further comprising:
a contacting step of causing gas flowing through the exhaust passage to pass through a scrubber filter disposed upstream of the drain port in the exhaust passage and to come into contact with the scrubbing liquid held by the scrubber filter; and
a liquid guiding step of causing a drain passage to guide liquid inside the exhaust passage along the drain passage from a position upstream of the scrubber filter toward the drain port through a position below the scrubber filter.

7. The substrate processing method according to claim 1, wherein
the substrate processing method further comprising: a contacting step of causing gas flowing through the exhaust passage to pass through a scrubber filter disposed in the exhaust passage and to come into contact with the scrubbing liquid held by the scrubber filter,
wherein the discharging step includes a step of causing the discharger to discharge constantly the selected scrubbing liquid.

8. The substrate processing method according to claim 1, wherein
the substrate processing method further comprising: a contacting step of causing gas flowing through the exhaust passage to pass through a scrubber filter disposed in the exhaust passage and to come into contact with the scrubbing liquid held by the scrubber filter,
wherein the discharging step includes a step of causing the discharger to discharge intermittently the selected scrubbing liquid.

9. The substrate processing method according to claim 8, wherein
the substrate processing method further comprising: a detecting step of causing an exhaust pressure sensor to detect a gas pressure in the exhaust passage;
wherein the discharging step includes a step of causing the discharger to discharge the selected scrubbing liquid intermittently based on a detection value of the exhaust pressure sensor.

10. The substrate processing method according to claim 1, further comprising:
a filter selecting step of selecting any one of a plurality of scrubber filters disposed in the exhaust passage based on the type of chemical liquid contained in the exhaust gas; and
a filter switching step of causing a filter switching apparatus to switch a state of each of the plurality of scrubber filters individually between a removal state in which the gas inside exhaust passage passes through the scrubber filter and a removal stop state in which the passage of the gas through the scrubber filter is stopped such that the exhaust gas passes through the selected scrubber filter selected in the filter selecting step.

11. The substrate processing method according to claim 1, further comprising:
a gas-liquid separating step of causing a gas-liquid separator disposed upstream of the discharger to remove liquid contained in the exhaust gas generated at the processing unit.

12. A substrate processing method comprising:
a processing step of causing each of a plurality of processing units included in a substrate processing apparatus to supply a plurality of types of chemical liquids to at least one substrate;
a first gas guiding step of causing each of a plurality of individual passages connected respectively to the plurality of processing units to guide exhaust gas generated at the processing unit and containing one of the plurality of types of chemical liquids to a collection passage connected to each of the plurality of individual passages;
a second gas guiding step of causing the collection passage to guide exhaust gas from the plurality of individual passages toward an exhaust equipment disposed outside the substrate processing apparatus;
a liquid selecting step of selecting any one of a plurality of types of scrubbing liquids to be discharged from any one of a plurality of dischargers included in the substrate processing apparatus and disposed respectively in the plurality of individual passages; and
a discharging step of causing any one of the plurality of dischargers to discharge the selected scrubbing liquid of the type selected in the liquid selecting step so as to bring the exhaust gas flowing through any one of the plurality of individual passages in contact with the selected scrubbing liquid.

13. The substrate processing method according to claim 12, further comprising:
a contacting step of causing gas flowing through the plurality of individual passages to pass through a plurality of scrubber filters disposed respectively in the plurality of individual passages and to come into contact with the scrubbing liquids held by the plurality of scrubber filters.

14. The substrate processing method according to claim 13, further comprising:
a mist-removing step of causing gas flowing through the plurality of individual passages to pass through a plurality of mist filters disposed respectively in the plurality of individual passages and disposed downstream of the plurality of dischargers, and causing each of the plurality of mist filters to remove liquid component contained in the gas.

15. The substrate processing method according to claim 12, further comprising:
- a liquid guiding step of causing a plurality of drain passages to guide liquid from each of the plurality of individual passages to the collection passage; and
- an expelling step of causing a drain port that opens inside the collection passage to suck liquid inside the collection passage so as to expel the liquid inside the collection passage.

16. A substrate processing method comprising:
- a processing step of causing each of a plurality of processing units included in a substrate processing apparatus to supply a plurality of types of chemical liquids to at least one substrate;
- a first gas guiding step of causing each of a plurality of individual passages connected respectively to the plurality of processing units to guide exhaust gas generated at the processing unit and containing one of the plurality of types of chemical liquids to a collection passage connected to each of the plurality of individual passages;
- a second gas guiding step of causing the collection passage to guide exhaust gas from the plurality of individual passages toward an exhaust equipment disposed outside the substrate processing apparatus;
- a liquid selecting step of selecting any one of a plurality of types of scrubbing liquids to be discharged from a discharger included in the substrate processing apparatus and disposed in the collection passage; and
- a discharging step of causing the discharger to discharge the selected scrubbing liquid of the type selected in the liquid selecting step so as to bring the exhaust gas flowing through the collection passage in contact with the selected scrubbing liquid.

17. The substrate processing method according to claim 16, further comprising:
- a contacting step of causing gas flowing through the collection passage to pass through a scrubber filter disposed in the collection passage and to come into contact with the scrubbing liquid held by the scrubber filter.

18. The substrate processing method according to claim 17, further comprising:
- a mist-removing step of causing gas flowing through the collection passage to pass through a mist filter disposed in the collection passage and disposed downstream of the discharger and the scrubber filter, and causing the mist filter to remove liquid component contained in the gas.

19. The substrate processing method according to claim 16, further comprising:
- a liquid guiding step of causing a plurality of drain passages to guide liquid from each of the plurality of individual passages to the collection passage; and
- an expelling step of causing a drain port that opens inside the collection passage to suck liquid inside the collection passage so as to expel the liquid inside the collection passage.

* * * * *